US008982629B2

(12) United States Patent
Dutta et al.

(10) Patent No.: US 8,982,629 B2
(45) Date of Patent: *Mar. 17, 2015

(54) METHOD AND APPARATUS FOR PROGRAM AND ERASE OF SELECT GATE TRANSISTORS

(71) Applicant: SanDisk Technologies Inc., Plano, TX (US)

(72) Inventors: Deepanshu Dutta, San Jose, CA (US); Yan Li, Milpitas, CA (US); Masaaki Higashitani, Cupertino, CA (US); Mohan Dunga, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/285,866

(22) Filed: May 23, 2014

(65) Prior Publication Data
US 2014/0254277 A1    Sep. 11, 2014

Related U.S. Application Data

(63) Continuation of application No. 13/739,673, filed on Jan. 11, 2013, now Pat. No. 8,861,282.

(51) Int. Cl.
G11C 11/34 (2006.01)
G11C 16/34 (2006.01)
G11C 16/14 (2006.01)
H01L 27/02 (2006.01)

(52) U.S. Cl.
CPC ............ *G11C 16/3445* (2013.01); *G11C 16/14* (2013.01); *G11C 16/3418* (2013.01); *G11C 16/3436* (2013.01); *G11C 16/349* (2013.01); *H01L 27/0255* (2013.01)

USPC ............ 365/185.17; 365/185.01; 365/185.03; 365/185.05; 365/185.18; 365/185.19; 365/185.22; 365/185.29

(58) Field of Classification Search
USPC ............ 365/185.01, 185.03, 185.05, 185.17, 365/185.18, 185.19, 185.22, 185.29
See application file for complete search history.

(56) References Cited

U.S. PATENT DOCUMENTS 6,479,851 B1    11/2002    Lee
7,079,437 B2    7/2006    Hazama et al.
(Continued)

OTHER PUBLICATIONS

U.S. Appl. No. 14/477,101 filed Sep. 4, 2014.
(Continued)

*Primary Examiner* — Fernando Hidalgo
(74) *Attorney, Agent, or Firm* — Vierra Magen Marcus LLP

(57) ABSTRACT

Techniques are provided for programming and erasing of select gate transistors in connection with the programming or erasing of a set of memory cells. In response to a program command to program memory cells, the select gate transistors are read to determine whether their Vth is below an acceptable range, in which case the select gate transistors are programmed before the memory cells. Or, a decision can be made to program the select gate transistors based on a count of program-erase cycles, whether a specified time period has elapsed and/or a temperature history of the non-volatile storage device. When an erase command is made to erase memory cells, the select gate transistors are read to determine whether their Vth is above an acceptable range. If their Vth is above the acceptable range, the select gate transistors can be erased concurrently with the erasing of the memory cells.

29 Claims, 23 Drawing Sheets

(56) References Cited

U.S. PATENT DOCUMENTS

| | | |
|---|---|---|
| 7,177,191 B2 | 2/2007 | Fasoli et al. |
| 7,551,466 B2 | 6/2009 | Aritome |
| 8,018,782 B2 | 9/2011 | Park et al. |
| 8,228,735 B2 | 7/2012 | Puzzilli et al. |
| 8,243,518 B2 | 8/2012 | Oh et al. |
| 2010/0124118 A1 | 5/2010 | Lee et al. |
| 2010/0127320 A1 | 5/2010 | Nishihara et al. |
| 2011/0309430 A1 | 12/2011 | Purayath et al. |
| 2013/0322174 A1* | 12/2013 | Li et al. .................... 365/185.09 |

OTHER PUBLICATIONS

U.S. Appl. No. 13/739,673 filed Jan. 11, 2013.

Notice of Allowance dated Aug. 11, 2014, U.S. Appl. No. 13/739,673 filed Jan. 11, 2013.

* cited by examiner

Fig. 15A

ABL programming

|  | SGD | SGS |
|---|---|---|
| BL: | 0 V | 0 V |
| SGD: | Vsgd_p | Vpass |
| WLDD: | Vpass | Vpass |
| WL0-WL63: | Vpass | Vpass |
| WLDS: | Vpass | Vpass |
| SGS: | 0 V | Vsgs_p |
| SL: | Vsl | 0 V |

Fig. 15B

ABL programming

|  | WL |
|---|---|
| BL: | 0 V |
| SGD: | Vsgd |
| WLDD: | Vpass |
| WL_sel: | Vwl_p |
| WL_unsel: | Vpass |
| WLDS: | Vpass |
| SGS: | 0 V |
| SL: | Vsl |

Fig. 15C

SBL programming

|  | SGD_even/odd | SGD_even | SGD_odd | SGS_even/odd |
|---|---|---|---|---|
| BL: | 0 V | 0 V | 0 V | 0 V |
| SGD_even: | Vsgd_p | Vsgd_p | Vpass | Vsgd |
| SGD_odd: | Vsgd_p | Vpass | Vsgd_p | Vsgd |
| WLDD: | Vpass | Vpass | Vpass | Vpass |
| WL0-WL63: | Vpass | Vpass | Vpass | Vpass |
| WLDS: | Vpass | Vpass | Vpass | Vpass |
| SGS_even/odd: | 0 V | 0 V | 0 V | Vsgs_p |
| SL: | Vsl | Vsl | Vsl | 0 V |

Fig. 15D

ABL program-verify

|  | SGD | SGS |
|---|---|---|
| BL: | Vsense | Vsense |
| SGD: | Vsgd_pv | Vsg |
| WLDD: | Vread | Vread |
| WL0-WL63: | Vread | Vread |
| WLDS: | Vread | Vread |
| SGS: | Vsg | Vsgs_pv |
| SL: | Vsl | Vsl |

Fig. 15E

ABL program-verify

|  | WL |
|---|---|
| BL: | Vsense |
| SGD: | Vsg |
| WLDD: | Vread |
| WL_sel: | VxL/H_pv |
| WL_unsel: | Vread |
| WLDS: | Vread |
| SGS: | Vsg |
| SL: | Vsl |

Fig. 15F

SBL program-verify

|  | SGD_even | SGD_odd | SGS_even/odd |
|---|---|---|---|
| BL: | Vsense | Vsense | Vsense |
| SGD_even: | Vsgd_even_pv | 0 V | Vsg |
| SGD_odd: | 0 V | Vsgd_odd_pv | Vsg |
| WLDD: | Vread | Vread | Vread |
| WL0-WL63: | Vread | Vread | Vread |
| WLDS: | Vread | Vread | Vread |
| SGS_even/odd | Vsg | Vsg | Vsgs_pv |
| SL: | Vsl | Vsl | Vsl |

Fig. 15G

SBL program-verify

|  | MC_even | MC_odd |
|---|---|---|
| BL: | Vsense | Vsense |
| SGD_even: | Vsg | 0 V |
| SGD_odd: | 0 V | Vsg |
| WLDD: | Vread | Vread |
| WL_sel: | VxL/H_pv | VxL/H_pv |
| WL_unsel: | Vread | Vread |
| WLDS: | Vread | Vread |
| SGS_even/odd: | Vsg | Vsg |
| SL: | Vsl | Vsl |

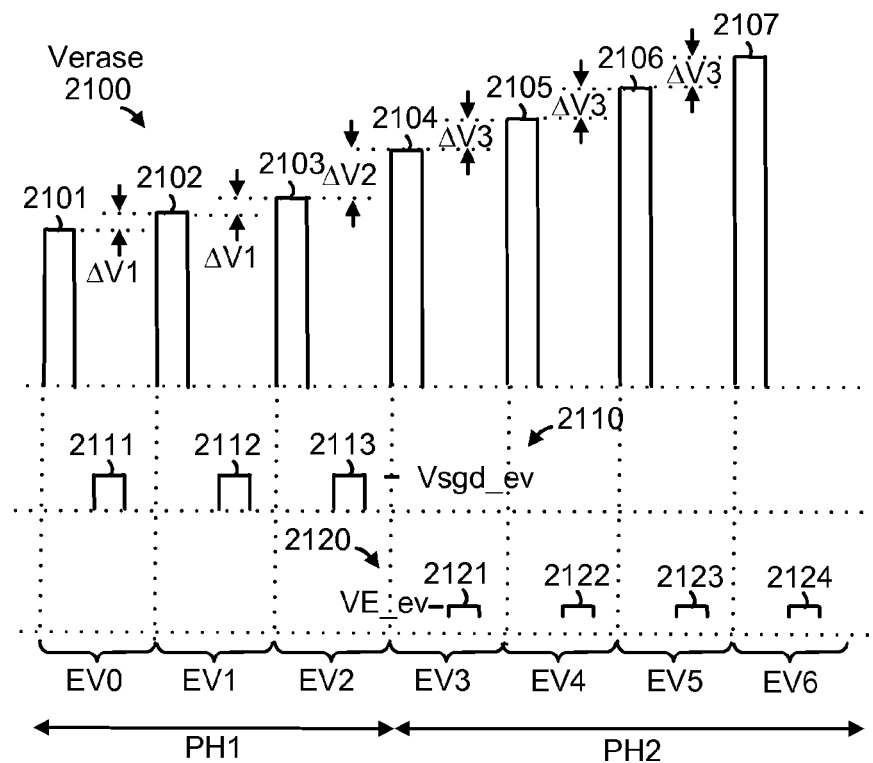

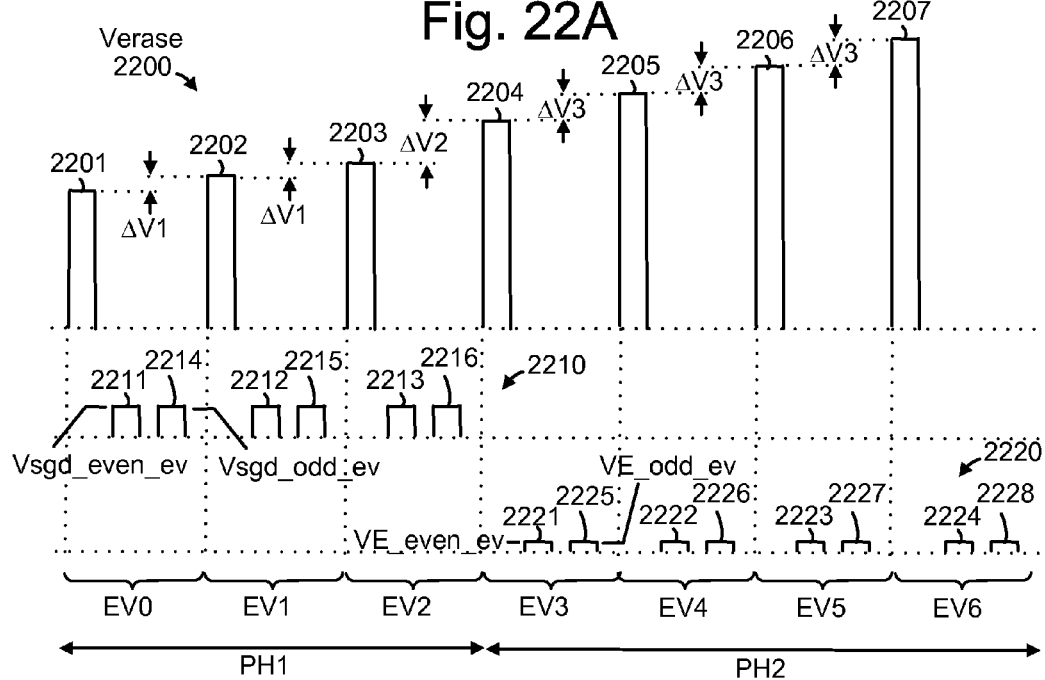
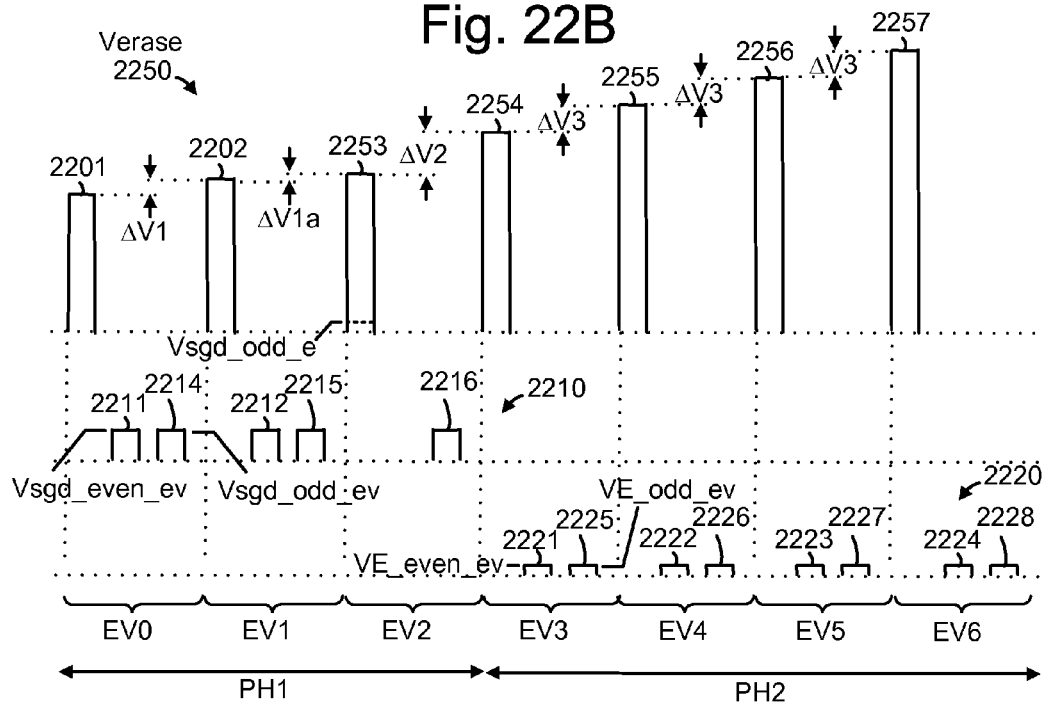

Fig. 23A

| | ABL erase | | |
|---|---|---|---|
| | SGD and MC | SGS and MC | SGD, SGS and MC |
| BL: | float | float | float |
| SGD: | Vsgd_e | float | Vsgd_e |
| WLDD: | Vwldd_e | Vwldd_e | Vwldd_e |
| WL0-WL63: | Vwl_e | Vwl_e | Vwl_e |
| WLDS: | Vwlds_e | Vwlds_e | Vwlds_e |
| SGS: | float | Vsgs_e | Vsgs_e |
| SL: | float | float | float |

Fig. 23B

| | ABL erase-verify | | |
|---|---|---|---|
| | SGD | SGS | MC |
| BL: | Vsense | Vsense | Vsense |
| SGD: | Vsgd_ev | Vsg | Vsg |
| WLDD: | Vread | Vread | Vread |
| WL0-WL63: | Vread | Vread | VE_ev |
| WLDS: | Vread | Vread | Vread |
| SGS: | Vsg | Vsgs_ev | Vsg |
| SL: | Vsl | Vsl | Vsl |

Fig. 23C

| | SBL erase | | |
|---|---|---|---|
| | SGD_even/ odd and MC_even/odd | SGD_even/odd, SGS_even/odd and MC_even/odd | SGS_even/ odd and MC_even/odd |
| BL: | float | float | float |
| SGD_even: | Vsgd_e | Vsgd_e | float |
| SGD_odd: | Vsgd_e | Vsgd_e | float |
| WLDD: | Vwldd_e | Vwldd_e | Vwldd_e |
| WL0-WL63: | Vwl_e | Vwl_e | Vwl_e |
| WLDS: | Vwlds_e | Vwlds_e | Vwlds_e |
| SGS_even/odd: | float | Vsgs_e | Vsgs_e |
| SL: | float | float | float |

Fig. 23D

| | SBL erase-verify | | | |
|---|---|---|---|---|
| | SGD_even | SGD_odd | SGS_even | SGS_odd |
| BL: | Vsense | Vsense | Vsense | Vsense |
| SGD_even: | Vsgd_even_ev | 0 V | Vsg | 0 V |
| SGD_odd: | 0 V | Vsgd_odd_ev | 0 V | Vsg |
| WLDD: | Vread | Vread | Vread | Vread |
| WL0-WL63: | Vread | Vread | Vread | Vread |
| WLDS: | Vread | Vread | Vread | Vread |
| SGS_even/odd: | Vsg | Vsg | Vsgs_ev | Vsgs_ev |
| SL: | Vsl | Vsl | Vsl | Vsl |

Fig. 23E

| | SBL erase-verify | |
|---|---|---|
| | MC_even | MC_odd |
| BL: | Vsense | Vsense |
| SGD_even: | Vsg | 0 V |
| SGD_odd: | 0 V | Vsg |
| WLDD: | Vread | Vread |
| WL0-WL63: | VE_ev | VE_ev |
| WLDS: | Vread | Vread |
| SGS_even/odd: | Vsg | Vsg |
| SL: | Vsl | Vsl |

…

METHOD AND APPARATUS FOR PROGRAM AND ERASE OF SELECT GATE TRANSISTORS

CLAIM OF PRIORITY

This application is a continuation application of U.S. patent application Ser. No. 13/739,673, entitled "Method And Apparatus For Program And Erase Of Select Gate Transistors," filed Jan. 11, 2013, published as US2014/0198575 on Jul. 17, 2014 and issued as U.S. Pat. No. 8,861,282 on Oct. 14, 2004, and incorporated herein by reference in its entirety.

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed Vth ranges. Each distinct Vth range corresponds to a predetermined value for the set of data bits encoded in the memory device. For example, each memory element can store two bits of data when the element can be placed in one of four discrete charge bands corresponding to four distinct Vth ranges.

BRIEF DESCRIPTION OF THE DRAWINGS

FIG. 6C depicts a Vth distribution of SGD transistors in a programming operation which follow the erase operation of FIG. 6B.

FIG. 15A depicts voltages during programming of SGD and SGS transistors in an ABL configuration in accordance with steps 1011 and 1012, respectively, of FIG. 10.

FIG. 15B depicts voltages during programming of memory cells in an ABL configuration in accordance with step 1004 of FIG. 10.

FIG. 15C depicts voltages during programming of SGD and SGS transistors in a SBL configuration in accordance with steps 1015-1018 of FIG. 10.

FIG. 15D depicts voltages during program-verify of SGD and SGS transistors in an ABL configuration in accordance with steps 1025 and 1026, respectively, of FIG. 10.

FIG. 15E depicts voltages during program-verify of memory cells in an ABL configuration in accordance with step 1004 of FIG. 10.

FIG. 15F depicts voltages during program-verify of SGD and SGS transistors in a SBL configuration in accordance with steps 1029-1032 of FIG. 10.

FIG. 15G depicts voltages during program-verify of memory cells in a SBL configuration in accordance with steps 1004 of FIG. 10.

FIG. 21 depicts waveforms in an example of an erase operation for SGD transistors and memory cells in accordance with steps 1706, 1712, 1724 and 1726 of FIG. 17.

FIG. 22A depicts an alternative to FIG. 21 in which SGD_even and SGD_odd transistors are separately verified.

FIG. 22B depicts an alternative to FIG. 22A, where the SGD_even transistors complete erase before the SGD_odd transistors.

FIG. 23A depicts voltages during erasing of SGD and SGS transistors and memory cells in an ABL configuration in accordance with steps 1611-1613 of FIG. 16.

FIG. 23B depicts voltages during erase-verify of SGD and SGS transistors and memory cells in an ABL configuration in accordance with steps 1621-1623 of FIG. 16.

FIG. 23C depicts voltages during erasing of SGD and SGS transistors and memory cells in a SBL configuration in accordance with steps 1615-1617 of FIG. 16.

FIG. 23D depicts voltages during erase-verify of SGD and SGS transistors and memory cells in an SBL configuration in accordance with steps 1625-1630 of FIG. 16.

FIG. 23E depicts voltages during erase-verify of memory cells in an SBL configuration in accordance with steps 1625-1630 of FIG. 16 as a continuation of FIG. 23D.

DETAILED DESCRIPTION

Figure 1:
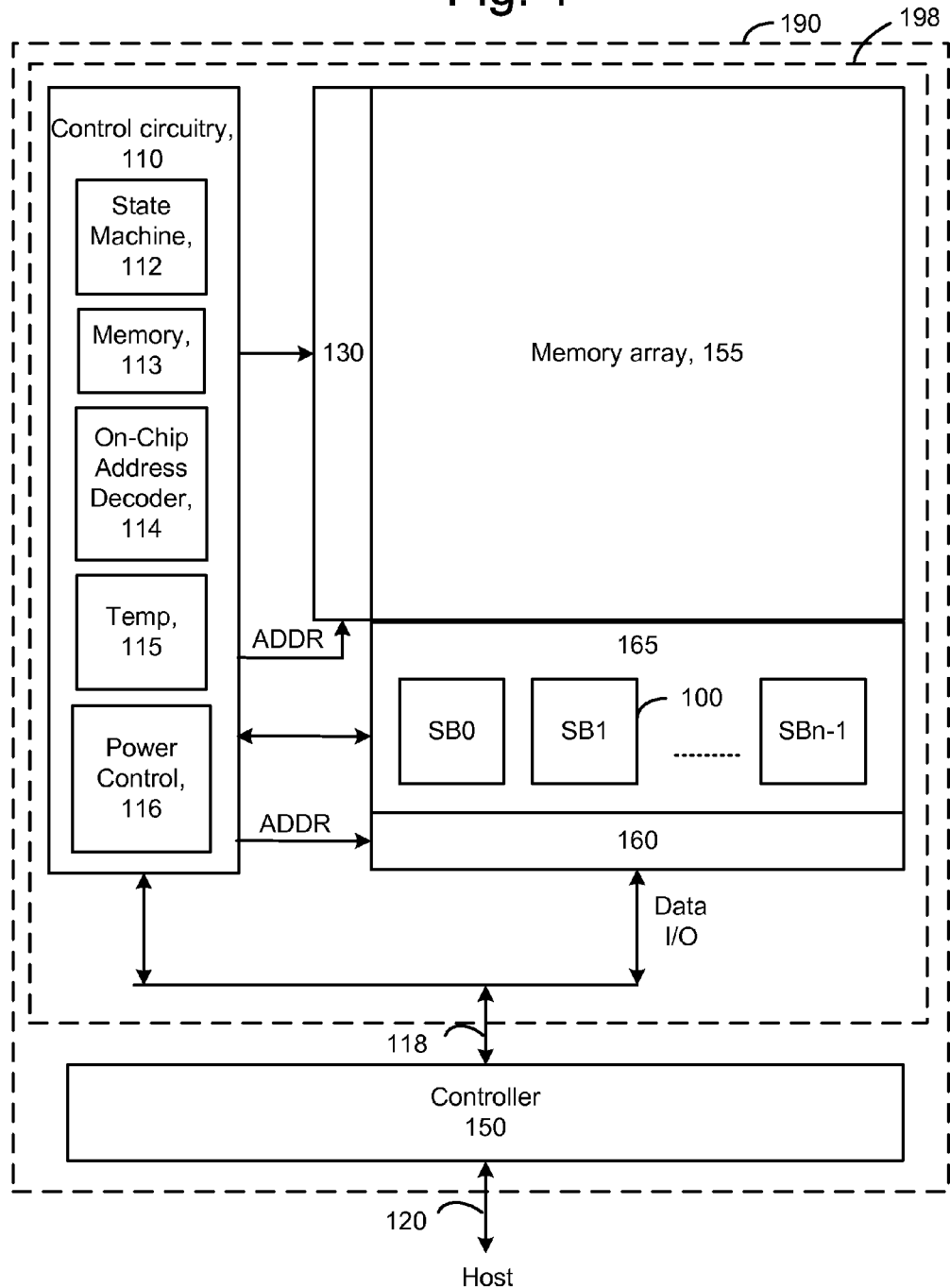
FIG. 1 is a block diagram of a non-volatile memory system using single row/column decoders and read/write circuits.

A method and apparatus for program and erase of select gate transistors of a NAND string are provided.

As memory devices become scaled down, configuring the Vth of the select gate transistors at the ends of a NAND string becomes more challenging. Maintaining the Vth within an acceptable range is important to ensure proper operation of the memory device. For example, the select gate transistors at the drain ends of a set of NAND strings have to be in a conductive or non-conductive state depending on whether the respective NAND string is to undergo programming or is to be inhibited from programming, respectively. During the fabrication process, implants such as Boron can be used to set the Vth of the select gate transistors. However, for various reasons, the Vth of a select gate transistor can move out of range, either too high or too low. This issue is a concern for various NAND string designs. One example design uses a wrap-around floating gate. Another example design is the flat memory cell or non-volatile storage element, which may be more susceptible to common-base junction leakage which changes the Vth. Furthermore, a SBL architecture can require higher Vth levels which are subject to drifting.

To overcome these issues, techniques are provided for programming and erasing of select gate transistors in connection with the programming or erasing, respectively, of the memory cells of a NAND string. In one approach, when a program command is made to program memory cells, the select gate transistors are read to determine whether their Vth is below an acceptable range. If their Vth is below the acceptable range, the select gate transistors can be programmed. Various programming techniques are provided for an ABL or SBL configuration. In other approaches, a decision is made to program the select gate transistors based on a count of program-erase cycles, whether a specified time period has elapsed since a last programming of the select gate transistors and/or a temperature history of the non-volatile storage device in the specified time period. An advantage is that the Vth of the select gate transistors can be returned to the acceptable range just before programming the memory cells so that programming of the memory cells is accurate.

In another approach, when an erase command for memory cells is issued, the select gate transistors are read to determine whether their Vth is above an acceptable range. If their Vth is above the acceptable range, the select gate transistors can be erased concurrently with the erasing of the memory cells. An advantage is that time is saved since separate erase operations for the select gate transistors and memory cells can be avoided. Another advantage is that the Vth of the select gate transistors is returned to the acceptable range so that the select gate transistors will be properly configured for subsequent programming of the memory cells. During the erase operation, an erase voltage can be applied to the substrate of the memory device which causes erasing of the select gate transistors and memory cells. Various erase techniques are provided for an ABL or SBL configuration. A decision can also be made to erase the select gate transistors based on the factors mentioned above (e.g., program-erase cycles, time elapsed and/or a temperature history).

The techniques provided herein can reduce the likelihood of program disturb by providing the Vth of select gate transistors in an acceptable range. The techniques provided herein can also potentially eliminate the need for implants to control the Vth of select gate transistors. This would save costs by removing a mask step from the fabrication process of the memory device.

These and other advantages will be further apparent in view of the following discussion.

The following notation is used:

ABL: all bit line;

SBL: shared bit line;

SGD: select gate transistor at drain end of NAND string;

SGD_even: select gate transistor at drain end of even-numbered NAND strings in SBL configuration;

SGD_odd: select gate transistor at drain end of NAND string for odd-numbered NAND strings in SBL configuration;

SGS: select gate transistor at source end of NAND string;

SGS_even: select gate transistor at source end of NAND string for even-numbered NAND strings in SBL configuration;

SGS_odd: select gate transistor at source end of NAND string for odd-numbered NAND strings in SBL configuration;

VA_r: read voltage for memory cells between Er and A states;

VAH_pv: higher program-verify voltage for A state, applied to selected word line:

VAL_pv: lower program-verify voltage for A state, applied to selected word line:

VB_r: read voltage for memory cells between A and B states;

VBH_pv: higher program-verify voltage for B state, applied to selected word line:

VBL_pv: lower program-verify voltage for B state, applied to selected word line:

VC_r: read voltage for memory cells between B and C states;

VCH_pv: higher program-verify voltage for C state, applied to selected word line:

VCL_pv: lower program-verify voltage for C state, applied to selected word line:

VE_ev: erase-verify voltage for memory cells, applied to word lines;

VE_even_ev: erase-verify voltage applied to word lines to verify memory cells of even-numbered NAND strings in a SBL configuration;

VE_odd_ev: erase-verify voltage applied to selected word line to verify memory cells of odd-numbered NAND strings in a SBL configuration;

Verase: erase voltage applied to substrate;

Verase_init: initial value of erase voltage applied to substrate;

Verase_init2: initial value of erase voltage applied to substrate at start of phase two of an erase operation;

Vread: a read-pass voltage; a control gate voltage applied to an unselected memory cell to provide it in a conductive state during sensing of a selected memory cell or select gate transistor in the same NAND string;

Vsg: control gate voltage applied to an unselected select gate transistor to provide it in a conductive state during sensing of a selected memory cell or a selected select gate transistor in the same NAND string;

Vsgd/s_p_init: initial value of program voltage applied to control gate of SGD or SGS transistor;

Vsgd: general voltage applied to control gate of SGD transistor;

Vsgd_e: voltage applied to control gate of SGD transistor during erase of that transistor;

Vsgd_ev: erase-verify voltage applied to control gate of SGD transistor;

Vsgd_even_ev: erase-verify voltage applied to control gate of SGD transistor of even-numbered NAND strings in a SBL configuration;

Vsgd_even_pv: program-verify voltage applied to control gate of SGD transistor of even-numbered NAND string in SBL configuration;

Vsgd_max_r: maximum read voltage applied to control gate of SGD transistor;

Vsgd_min_r: minimum read voltage applied to control gate of SGD transistor;

Vsgd_odd_ev: erase-verify voltage applied to control gate of SGS transistor of odd-numbered NAND strings in a SBL configuration;

Vsgd_odd_pv: program-verify voltage applied to control gate of SGD transistor of odd-numbered NAND string in SBL configuration;

Vsgd_p: program voltage applied to control gate of SGD transistor;

Vsgd_pv: program-verify voltage applied to control gate of SGD transistor;

Vsgs: general voltage applied to control gate of SGS transistor;

Vsgs_e: voltage applied to control gate of SGS transistor during erase of that transistor;

Vsgs_ev: erase-verify voltage applied to control gate of SGS transistor;

Vsgs_p: program voltage applied to control gate of SGS transistor;

Vsgs_pv: program-verify voltage applied to control gate of SGS transistor;

Vsl: voltage applied to source line;

Vwl_e: voltage applied to word lines during erase of memory cells;

Vwl_p: program voltage applied to selected word line;

Vwl_p_init: initial value of program voltage applied to word line;

Vwldd_e: voltage applied to dummy word line at drain side of NAND string in erase operation;

Vwlds_e: voltage applied to dummy word line at source side of NAND string during erase;

VxL/H_pv: general low (L) or high (H) program-verify voltage for "X" state, applied to selected word line;

An example memory system which can be used is discussed next. Generally, any type of non-volatile memory can be used. A memory with NAND strings is an example only. FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array 155 of storage elements, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, a temperature measuring circuit 115, and a power control module 116. The state machine 112 provides chip-level control of memory operations. The on-chip address decoder 114 provides an address interface between that used by the host or a memory controller to the hardware address used by the decoders 130 and 160. The temperature measuring circuit can be used to periodically record ambient temperatures of the memory device to provide a temperature history. An example implementation uses a band gap current which is sensitive to temperature. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit.

For example, one or more control circuits may include any one of, or a combination of, control circuitry 110, state machine 112, decoders 114/160, power control module 116, sense blocks 100 (including the processor 192 and managing circuit MC0 in FIG. 3), read/write circuits 165, and controller 150, and so forth. The sense block 100 is discussed further in connection with FIG. 3.

Figure 2A:
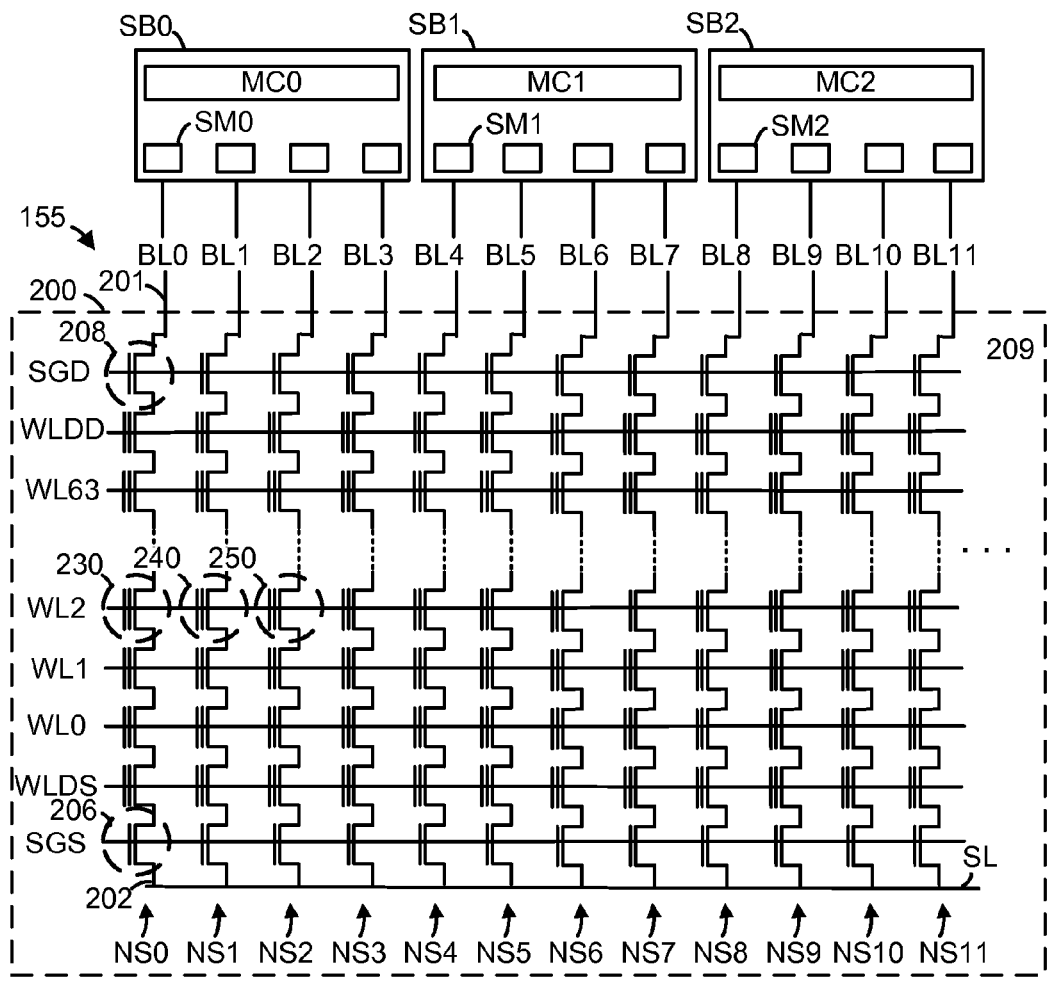
FIG. 2A depicts a block of NAND flash memory cells in the memory array 155 of FIG. 1 and associated sense blocks SB0, SB1 and SB2, where each NAND string is connected to a respective sense module in an all bit line (ABL) configuration.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half FIG. 2A depicts a block of NAND flash memory cells in the memory array 155 of FIG. 1 and associated sense blocks SB0, SB1 and SB2, where each NAND string is connected to a respective sense module in an ABL configuration. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gate transistors are connected via a common SGD line. The NAND strings are connected at their other end to a source select gate which, in turn, is connected to a common source line SL. For example, NS0 includes a source-side select gate transistor 206 connected at an end 202 to the SL, and a drain-side select gate transistor 208 connected at an opposite end 201 of the NAND string to BL0. Example storage elements (memory cells) are in NS0, NS1 and NS2, respectively, and are connected to WL2. For example, WL2 could be a selected word line which is selected for programming and the storage elements 230, 240, 250, among others on WL2, can be storage elements which are selected for programming.

Sixty-four word lines, for example, WL0-WL63, extend between the source-side select gate transistors and the drain-side select gate transistors. These are word lines connected to storage elements which can store user data. Dummy word lines such as WLDS and WLDD can be connected to storage elements (dummy memory cells) which do not store user data. These storage elements help isolate the select gate transistors from the data-storing storage elements. The block is formed on a substrate 209.

In one approach, one sense block is provided for a group of NAND strings, such as four NAND strings. For example, SB0 is associated with BL0-BL3 , SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3.

FIG. 2A depicts an ABL configuration in which each bit line or NAND string is connected to a respective sense module so that sensing can occur concurrently in the NAND strings. In contrast, FIG. 2B, discussed further below, depicts a SBL configuration in which groups of bit lines or NAND strings (such as two bit lines or NAND strings per group) are connected to a respective sense module so that sensing can occur for one NAND string in a group at a time.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
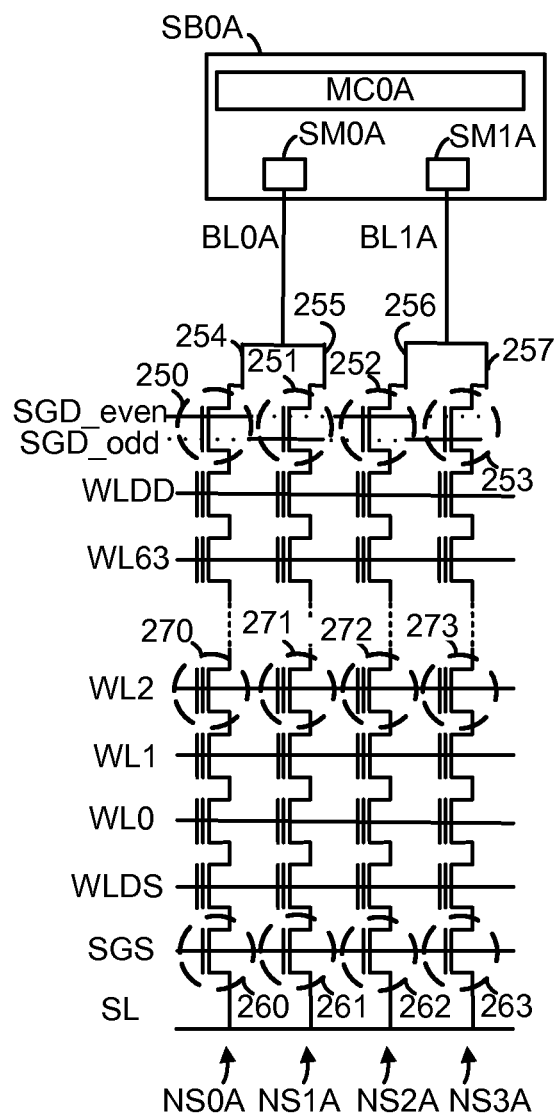
FIG. 2B depicts an alternative arrangement of NAND flash memory cells in the memory array 155 of FIG. 1, where a sense module is shared by even- and odd-numbered NAND strings in a shared bit line (SBL) configuration.

FIG. 2B depicts an alternative arrangement of NAND flash memory cells in the memory array 155 of FIG. 1, where a sense module is shared by even- and odd-numbered NAND strings in a SBL configuration. Four NAND strings, NS0A, NS1A, NS2A and NS3A, are provided as an example. NS0A and NS1A are connected to a bit line BL0A and to a sense module SM0A in a sense block SB0 A having a managing circuit MC0A, and NS2A and NS3A are connected to a bit line BL1A and to a sense module SM1A in the sense block SB0A. NS0A and NS2A are examples of even-numbered NAND strings and NS1A and NS3A are examples of odd-numbered NAND strings. NS0A, NS1A, NS2A and NS3A include SGD transistors 250, 251, 252 and 253, respectively, SGS transistors 260, 261, 262 and 263, respectively, drain ends 254, 255, 256 and 257, respectively, and example selected storage elements 270, 271, 272 and 273, respectively, in WL2. The drain ends 254 and 255 are connected to BL0A, and the drain ends 256 and 257 are connected to BL1A.

Further, in one possible implementation, separate control lines SGD_even and SGD_odd are connected to the control gates of the SGD transistors of the even- and odd-numbered NAND strings. For example, SGD_even is connected to SGD transistors 250 and 252 in NS0A and NS2A, respectively, and SGD_odd is connected to SGD transistors 251 and 253 in NS1A and NS3A, respectively.

Figure 3:
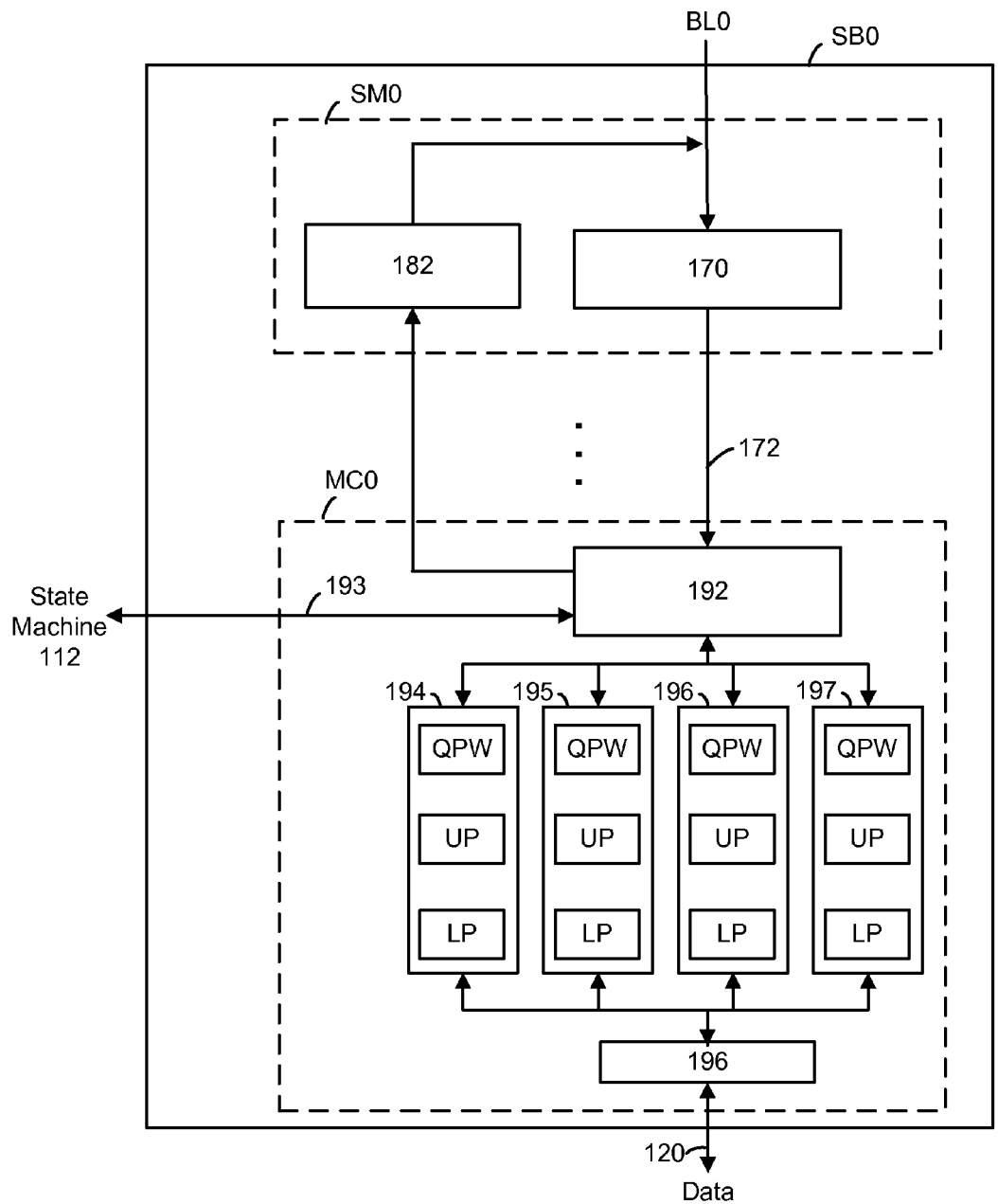
FIG. 3 is a block diagram depicting one embodiment of the sense block SB0 of FIG. 1.

FIG. 3 is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of storage elements.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 allows programming.

Managing circuit MC0 comprises a processor 192, four example sets of data latches 194, 195, 196 and 197 and an I/O Interface 196 coupled between the set of data latches 194 and data bus 120. One set of data latches can be provide for each sense module, and data latches identified by LP, UP and QPW may be provided for each set. In some cases, additional data latches may be used. In other cases, fewer data latches may be used. LP stores a bit for a lower page of data, and UP stores a bit for an upper page of data. This is in a four-level or two-bits per storage element memory device. QPW can be used to store a bit which indicates whether the associated storage element is in a quick pass write mode (e.g., whether its Vth is between the lower and higher verify levels in which case the storage element experiences slow programming).

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed storage element. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant state bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP latches, in a two-bit per storage element implementation. In a three-bit per storage element implementation, two upper data latches may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operation. For example, latches may identify that the Vth of a storage element is below a particular verify level. The data latches indicate whether a storage element currently stores one or more bits from a page of data. For example, the LP latches can be used to store a lower page of data. An LP latch is flipped (e.g., from 0 to 1) when a lower page bit is stored in an associated storage element. The UP latches can be used to store an upper page of data, for instance. A UP latch is flipped when an upper page bit is stored in an associated storage element. The flipping of a bit occurs when an associated storage element completes programming, e.g., when its Vth exceeds a target verify level such as VAH_pv, VBH_pv or VCH_pv. When lower, middle and upper page bits are used, they are stored in latches referred to as LP, MP and UP, respectively. MP is flipped when a middle page bit is stored in an associated storage element, and UP is flipped when an upper page bit is stored in an associated storage element. The concept can be extended to more than three bits per cell as well.

Figure 4A:
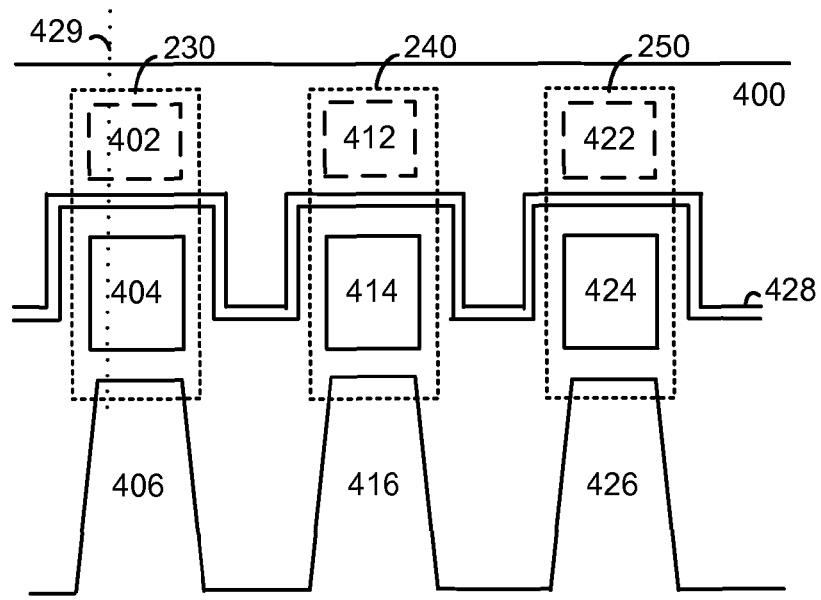
FIG. 4A depicts a cross-sectional view of the NAND strings of FIG. 2A or 2B in an embodiment comprising a wraparound control gate.

FIG. 4A depicts a cross-sectional view of the NAND strings of FIG. 2A or 2B in an embodiment comprising a wraparound control gate. A bit line or NAND string direction goes into the page, and a word line direction goes from left to right. As an example, word line 400 such as WL2 extends across NAND strings NS0, NS1 and NS2 which include respective channel regions 406, 416 and 426. The storage element 230 in NS0 includes a control gate 402, a floating gate 404 and the channel region 406. The storage element 240 in NS1 includes a control gate 412, a floating gate 414 and the channel region 416. The storage element 250 in NS2 includes a control gate 422, a floating gate 424 and the channel region 426. An inter-poly dielectric (IPD) layer 428 is also depicted. The control gates are portions of the word line. A cross-sectional view along line 429 is provided in FIG. 4C.

Here, the control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 4B:
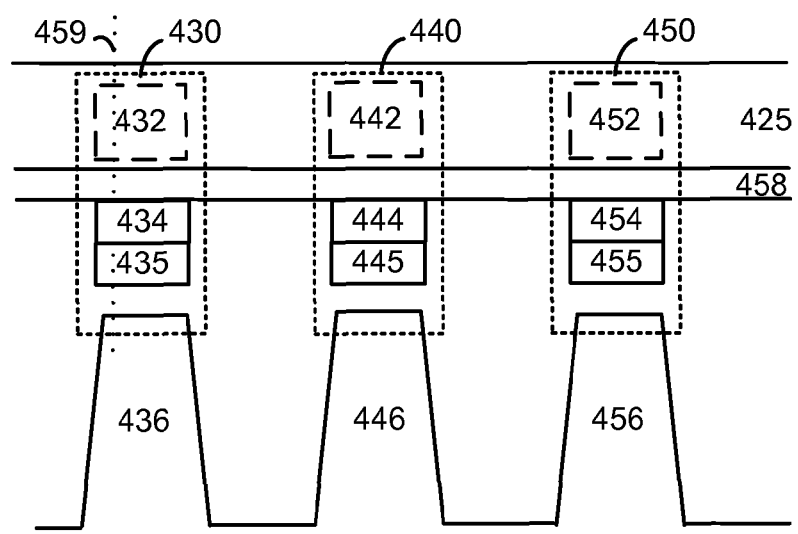
FIG. 4B depicts a cross-sectional view of the NAND strings of FIG. 2A or 2B in an embodiment comprising a flat control gate.

FIG. 4B depicts a cross-sectional view of the NAND strings of FIG. 2A or 2B in an embodiment comprising a flat control gate. A bit line or NAND string direction goes into the page, and a word line direction goes from left to right. As an example, word line 425 such as WL2 extends across NAND strings NS0, NS1 and NS2 which include respective channel regions 436, 446 and 456. An IPD layer 458 is depicted. The storage element 430 in NS0 includes a control gate 432, a charge trapping layer 434, a polysilicon layer 435 and the channel region 436. The storage element 440 in NS1 includes a control gate 442, a charge trapping layer 444, a polysilicon layer 445 and the channel region 446. The storage element 450 in NS2 includes a control gate 452, a charge trapping layer 454, a polysilicon layer 455 and the channel region 456. The control gates are portions of the word line. A cross-sectional view along line 459 is provided in FIG. 4D.

Figure 4C:
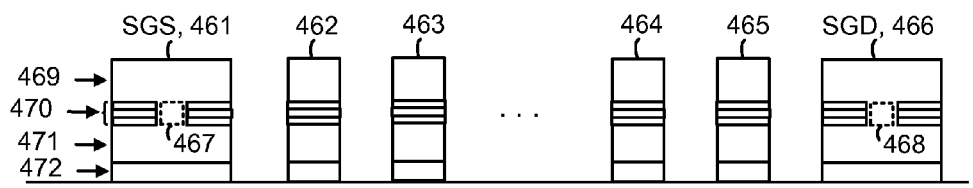
FIG. 4C depicts a cross sectional view along line 429 in FIG. 4A, showing a NAND string of the embodiment having a wraparound control gate.

FIG. 4C depicts a cross sectional view along line 429 in FIG. 4A, showing a NAND string of the embodiment having a wraparound control gate. The NAND string 460 can represent NS0 in FIG. 2A or NS0A in FIG. 2B, for instance. It includes an SGS transistor 461, example storage elements 462, 463, 464 and 465 and an SGD transistor 466. A control gate layer 469, IPD layer 470, floating gate layer 471 and tunnel oxide layer 472 may be present in each of the select gate transistors and storage elements. Further, passageways 467 and 468 in the SGS and SGD transistors, respectively, allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

Figure 4D:
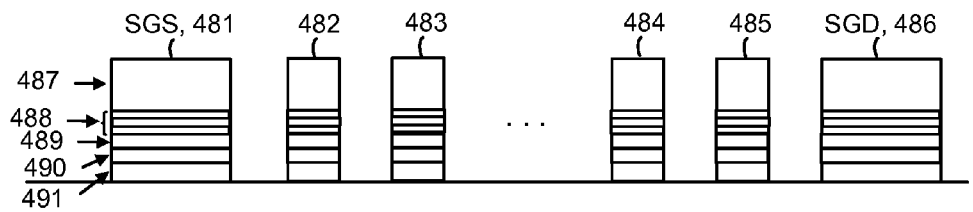
FIG. 4D depicts a cross sectional view along line 459 in FIG. 4B, showing a NAND string of the embodiment having a flat control gate.

FIG. 4D depicts a cross sectional view along line 459 in FIG. 4B, showing a NAND string of the embodiment having a flat control gate. The NAND string 480 can represent NS0 in FIG. 2A or NS0A in FIG. 2B, for instance. It includes an SGS transistor 481, example storage elements 482, 483, 484 and 485 and an SGD transistor 486. A control gate layer 487, IPD layer 488, charge trap layer 489, polysilicon layer 490 and tunnel oxide layer 491 may be present in each of the select gate transistors and storage elements. The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge trapping or charge storing layer. The charge trap layer can be a mix of silicon nitride and oxide, for instance. A difference between the floating gate memory cell and the flat memory cell is the height of the charge storage layer. A typically floating gate height may be about 100 nm, while a charge trap layer can be as small as 3 nm, and the polysilicon layer can be about 5 nm.

With a thin charge trap layer, it can be difficult to form the SGD and SGS transistors. In the configuration of FIG. 4C, a passageway is etched through the IPD stack. When the control gate polysilicon is deposited, it fills the passageway, forming a floating gate to control gate Ohmic contact. Since the floating gate is tall, it is acceptable for the passageway to be slightly over-etched. However, such etching is not used in the configuration of FIG. 4D due to the reduced height. As a result, the SGD and SGS transistors have the same configuration as the storage elements but with a longer channel length to ensure that current is cutoff in an inhibited NAND string.

Figure 4E:
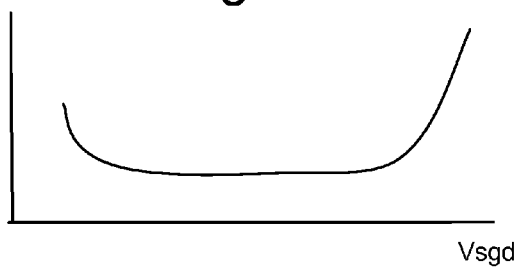
FIG. 4E is a plot depicting a Vsgd window, showing a number of fail bits in a memory device as a function of Vsgd.

FIG. 4E is a plot depicting a Vsgd window, showing a number of fail bits in a memory device as a function of Vsgd. The horizontal axis depicts Vsgd and the vertical axis depicts a number of fail bits. For a storage device having four data states: erased (Er), A, B and C, a storage element can experience a failure in which its data state changes due to a change in its Vth. Such a storage element is referred to as a fail bit. This failure can occur during programming. For example, for an inhibited NAND string, a goal is for the SGD transistor to be non-conductive to allow boosting in the channel region of the NAND string. A bit line voltage at a power supply level such as Vdd=2.5 V is applied, so that, for the SGD transistor to be non-conductive, Vsgd should be less than 2.5 V+Vth of the SGD transistor. If the Vth is assumed to be 1.5 V, then Vsgd should be less than 4 V. If Vsgd is more than 4 V, or if the Vth is less than 1.5 V, the SGD transistor can become conductive. With insufficient boosting, Er state-to-A state failures are common.

For an uninhibited NAND string, a goal is for the SGD transistor to be conductive to allow the bit line voltage to communicate with the channel region of the NAND string. A bit line voltage such as 0 V is applied, so that, for the SGD transistor to be conductive, Vsgd should be more than 1.5 V. If Vsgd is less than 1.5 V, or if the Vth is more than 1.5 V, the SGD transistor can become non-conductive. A state-to-B state failures are common in this situation. In a slow programming mode, a bit line voltage such as 0.8 V is used. In this case, for the SGD transistor to be conductive, Vsgd should be more than 2.3 V.

Thus, the Vth of the SGD transistor should be kept within an acceptable range. The Vth of the SGS transistors should also be kept within an acceptable range although the SGS transistor typically has a fairly high back bias that helps to keep it in the non-conductive state during a programming operation. As mentioned at the outset, during the fabrication process, implants such as Boron can be used to set the Vth of the select gate transistors. However, if the Vth is made too high by implants, common-base junction leakage can increase, in particular, with the flat memory cell. Another approach to compensate for a Vth which is too low in a select gate transistor is to use a negative Vsgd during programming, but this requires additional circuits to generate the negative voltage, resulting in additional size and cost.

Another challenge, as mentioned, is that the SBL architecture such as depicted in FIG. 2B can require higher Vth levels which can drift. With the ABL architecture of FIG. 2A, each NAND string has its own bit line, and the worst case for boost leakage through the SGD transistor occurs when the NAND string is inhibited. In this case, the SGD transistor is made conductive by setting Vbl to a power supply level (Vdd) such as 2.5V. With the SBL architecture, a pair of adjacent NAND strings share a bit line, and the worst case occurs when one of the NAND strings of the pair is to be inhibited, while the other is to be uninhibited/programmed. For example, in FIG. 2B, assume NS0A is to be inhibited and NS1A is to be programmed. In this case, BL0A will be at 0 V, for instance. The SGD transistor 250 which is in NS0A should be non-conductive to ensure no boost leakage in NS0A. SGD_even, which is connected to the SGD transistor 250, will be set at 0 V. However, even in this case, the SGD transistor 250 may not be completely non-conductive. It may be desirable for the Vth of the SGD transistor 250 to be made higher to ensure that the SGD transistor 250 is non-conductive.

The SGD transistor 251 in NS1A should be conductive to allow BL0A to communicate with the associated channel of NS1A to allow programming to occur. In this case, SGD_odd, which is connected to the SGD transistor 251, will be set at 2.5 V. Moreover, in some cases, it can be useful to set the SGD transistors of even- and odd-numbered NAND strings differently.

Techniques for adjusting the Vth of select gate transistors by program and erase are now discussed in further detail.

Figure 4F:
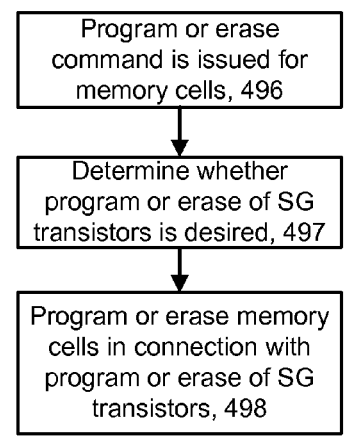
FIG. 4F is a flowchart depicting a process for program or erase of memory cells in connection with program or erase of select gate transistors.

FIG. 4F is a flowchart depicting a process for program or erase of memory cells in connection with program or erase of select gate transistors. At step 496, a program or erase command is issued for the memory cells, such as by the state machine. A program command can involve programming data such as a page of data in selected memory cells connected to a selected word line. An erase command can involve erasing a block of memory cells. Step 497 determines whether program or erase of select gate (SG) transistors is desired. Step 498 programs or erases the memory cells in connection with a program or erase of the select gate transistors. Various implementations are discussed below.

Generally, a select gate transistor can be programmed after it has been erased, to ensure that its Vth is in an acceptable range. In one approach, the programming can be prompted by the completion of an erase operation, e.g., after erasing both the select gate transistors and the memory cells. In another approach, the select gate transistors are programmed after they have completed erase but before the memory cells have completed programming. In another approach, the select gate transistors are programmed in connection with programming of memory cells, such as just before a programming operation begins for the memory cells in a block.

In most cases, when the select gate transistors are erased and programmed to the desired target level, their Vth will remain roughly constant. In this case, there is no real need to erase and program the select gate transistors each time a block of memory cells is programmed or erased. In fact, program and erase of the select gate transistors should be minimized to minimize cycling which can degrade the select gate transistors. A pre-verify or read can be performed on the select gate transistors before they are erased or programmed, to judge whether they need to be erased or programmed. For example, before initiating an erase sequence on the select gate transistors, a read at a read level of Vsgd_max_r (see FIG. 6A-6C) can be done to check whether all (or most) of the SGD transistors, for instance, have a Vth below this read level. If all (or most) of the SGD transistors have a Vth below this read level, then the SGD transistors need not be erased. Instead, only the word lines are erased, if needed. If all (or most) of the SGD transistors do not have a Vth below this read level, then an erase sequence for the SGD transistors can be initiated.

Similarly, before initiating a program sequence on the select gate transistors, a read at a read level of Vsgd_min_r (see FIG. 6A-6C) can be done to check whether all (or most) of the SGD transistors, for instance, have a Vth above this read level. If all (or most) of the SGD transistors have a Vth above this read level, then the SGD transistors need not be programmed. Instead, only the word lines are programmed, if needed. If all (or most) of the SGD transistors do not have a Vth above this read level, then a program sequence for the SGD transistors can be initiated. The read levels can be more relaxed than verify levels used during program and erase.

Figure 5A:
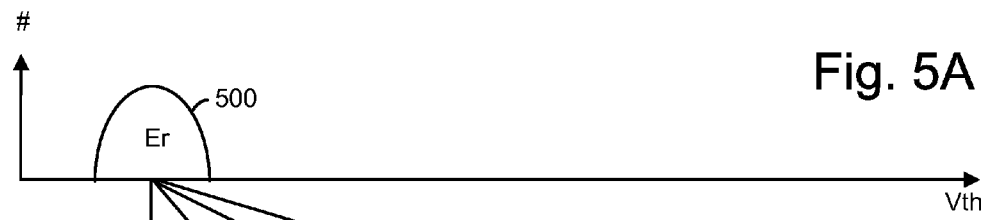
FIGS. 5A and 5B depict Vth distributions of memory cells in a one-pass programming operation with four data states, in accordance with FIG. 4F.
Figure 5B:
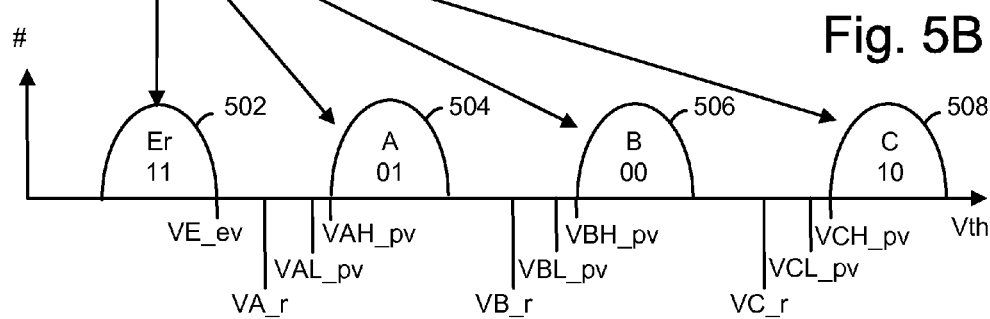

FIGS. 5A and 5B depict Vth distributions of memory cells in a one-pass programming operation with four data states, in accordance with FIG. 4F. The x-axis indicates a threshold voltage and the y-axis indicates a number of storage elements. In this example, there are four data states (each represented by a threshold voltage distribution): an erased state (Er) distribution 502, an A state distribution 504, a B state distribution 506 and a C state distribution 508. Memory devices with additional data states, e.g., eight or sixteen data states, can also be used.

Storage elements can be programmed so that their threshold voltages are in respective ranges which represent data states. Initially, an erase operation is performed which places all of the storage elements in the erased state (Er). In an erase operation one or more erase pulses are applied to the substrate of the memory device until the threshold voltage of the storage elements being erased transitions below an erase-verify level, VE_ev which can be 0 V or close to 0 V, in one approach. Optionally, the erase operation includes a soft programming operation in which one or more positive voltage pulses are applied to the control gates of the storage elements, such as via a word line, to increase their threshold voltages slightly. Subsequently, a programming operation is performed in which some of the storage elements are programmed to a higher threshold voltage such as to represent the A, B or C programmed data states. The programming operation may include one or more passes, or sequences of increasing program pulses.

One-pass programming is also referred to as "one-pass write" programming. A programming pass is generally meant to encompass a sequence of multiple program-verify operations which are performed until the threshold voltages of a set of selected storage elements reach one or more respective verify levels of respective target data states. See FIG. 14, for example. In one-pass programming, the storage elements are initially in an erased state. Some of the storage elements are not programmed and remain in the erased state while others are programmed to higher target data states.

Example Vth distributions for the storage element array are provided for a case where each storage element stores two bits of data. Each graph depicts Vth on the horizontal axis and a number or population of storage elements in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 502 is provided for erased (Er) state storage elements. Vth distributions 504, 506 and 508 represent target data states A, B and C, respectively, which are reached by storage elements when their threshold voltage exceeds a higher verify level VAH_pv, VBH_pv or VCH_pv, respectively. In this case, each storage element can store two bits of data in one of four possible Vth ranges, referred to as states Er, A, B and C. A program option which uses a slow programming mode may be referred to as a "quick pass write" (QPW)

technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VAL_pv, VBL_pv or VCL_pv) are defined which are offset below the respective higher verify levels. When a verify test determines that the threshold voltage of a storage element exceeds the lower verify level associated with the target data state of the storage element, a slow programming mode begins for the storage element. Subsequently, when a verify test determines that the threshold voltage of a storage element exceeds the higher verify level associated with the target data state of the storage element, the storage element is locked out from further programming.

The specific relationship between the data programmed into the storage element and the Vth levels of the storage element depends upon the data encoding scheme adopted for the storage elements. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the Er, A, B and C state. Read reference voltages VA_r, VB_r and VC_r which are between the distributions are used for reading data from the storage elements. By testing whether the Vth of a given storage element is above or below one or more of the read reference voltages, the system can determine the data state which is represented by a storage element.

Figure 6A:
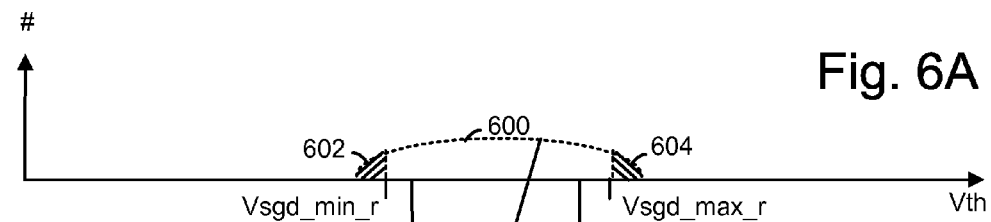
FIGS. 6A and 6B depict a Vth distribution of SGD transistors in an erase operation and FIGS. 6B and 6C depict a Vth distribution of SGD transistors in a programming operation, in accordance with FIG. 4F.
Figure 6B:
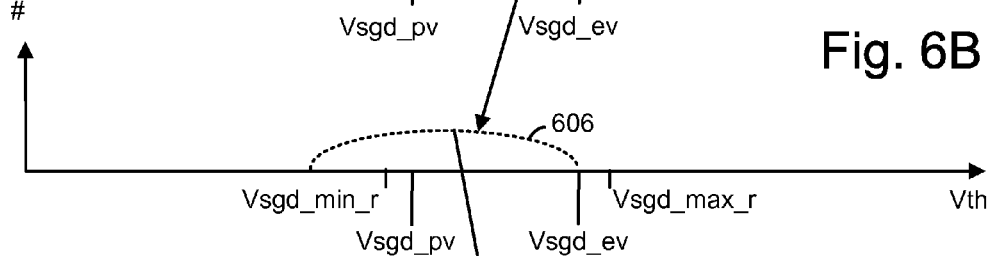
Figure 6C:
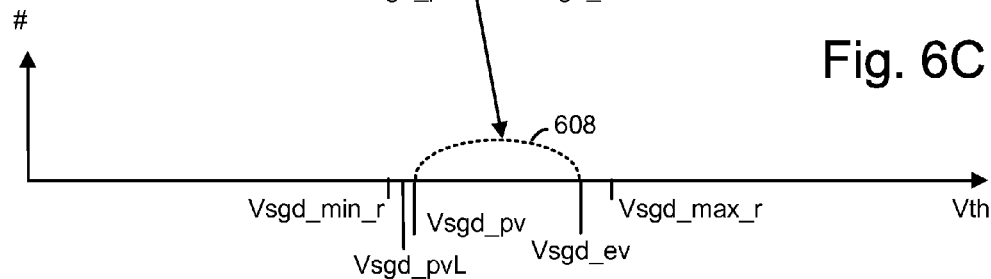

FIGS. 6A and 6B depict a Vth distribution of SGD transistors in an erase operation and FIGS. 6B and 6C depict a Vth distribution of SGD transistors in a programming operation, in accordance with FIG. 4F.

A similar distribution could be depicted for SGS transistors. The horizontal axis depicts a range of acceptable Vth values which extends from Vsgd_min_r to Vsgd_max_r. In one approach, the SGD transistors are read using Vsgd_min_r to identify a portion 602 of the Vth distribution 600 which represents SGD transistors for which the Vth is below the range of acceptable Vth values. Similarly, the SGD transistors could be read using Vsgd_max_r to identify a portion 604 of the Vth distribution 600 which represents SGD transistors for which the Vth is above the range of acceptable Vth values.

At the same time the storage elements are being erased, the select gate transistors can also be erased. For example, the Vth distribution 600 of the select gate transistors can transition to the distribution 606 during an erase operation using Vsgd_ev as a control gate voltage of an erase-verify test. The erase-verify test of the select gate transistors can be performed separately from the erase-verify test of the storage elements. Various examples regarding the timing of erase voltages and the erase-verify tests are discussed further below.

Subsequently, the Vth distribution 606 of the select gate transistors can transition to the distribution 608 of FIG. 6C during a programming operation using Vsgd_pv as a control gate voltage of a program-verify test.

FIG. 6C depicts a Vth distribution of SGD transistors in a programming operation which follow the erase operation of FIG. 6B. Vsgd_ev represents an erase-verify level which is used in erasing the SGD transistors to achieve the Vth distribution 608. In this example, the Vth distribution 608 is tightened compared to the Vth distribution 606. This can occur when the select gate transistors that pass the program-verify test can be inhibited from being further programmed, such as in an ABL configuration. In other cases, the Vth distribution will be shifted rather than tightened, e.g., when the select gate transistors that pass the program-verify test are not inhibited from being further programmed, such as in an SBL configuration. Generally, programming alone, erasing alone, programming followed by erasing, or erasing followed by programming, can be performed for the select gate transistors.

Note that Vsgd_pv>Vsgd_min_r and Vsgd_ev<Vsgd_max_r, to allow a margin at the lower and upper ends of the distribution. That is, after programming and/or erasing is completed, the Vth can change by a small amount without being outside the acceptable range of threshold voltages (e.g., Vsgd_min_r to Vsgd_max_r), so that another program or erase is not unnecessarily triggered. Alternatively, the verify levels can be the same as the respective read levels so there is no such margin.

Figure 13:
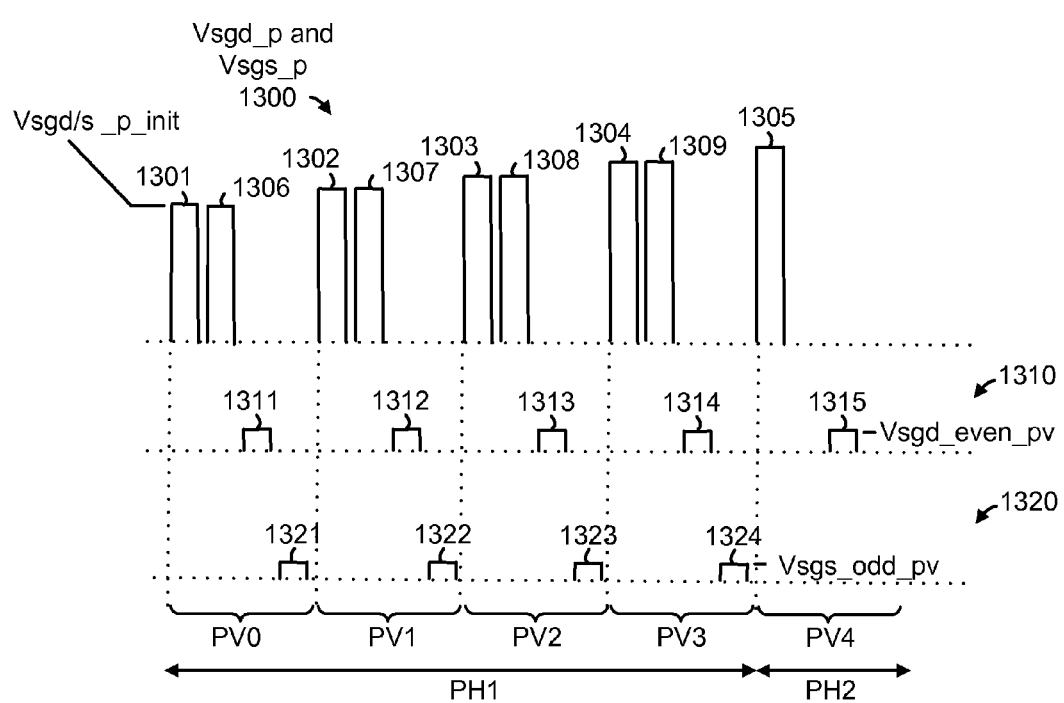
FIG. 13 depicts waveforms in an example of a programming operation for SGD transistors in accordance with steps 1016, 1017, 1029 and 1030 of FIG. 10.

In a QPW implementation, a lower program-verify level Vsgd_pvL can be used in addition to Vsgd_pv, which becomes a higher program-verify level, as discussed further in connection with FIG. 13.

Figure 7A:
FIGS. 7A to 7C depict Vth distributions of memory cells in a two-pass programming operation with four data states, in accordance with FIG. 4F.
Figure 7B:
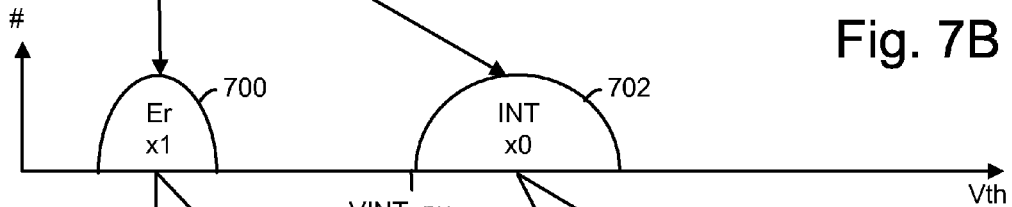
Figure 7C:
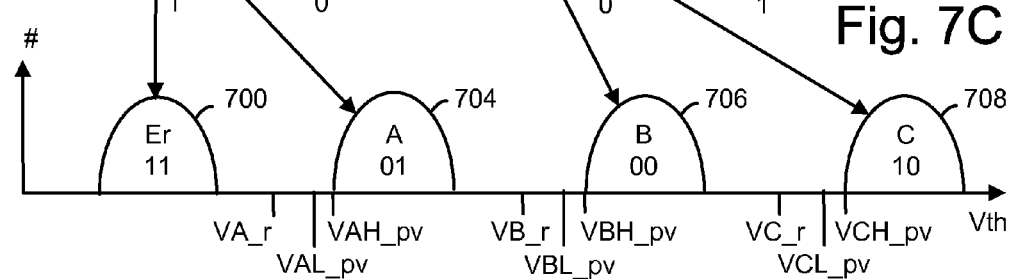

FIGS. 7A to 7C depict Vth distributions of memory cells in a two-pass programming operation with four data states, in accordance with FIG. 4F. Each pass can be used to program a page of data. For example, programming of lower and upper pages in two-bit, four-level storage elements is provided. Programming can be performed one logical page at a time, with the lower page followed by the upper page. Initially, all storage elements are in the erased (Er) state, represented by the distribution 700.

FIG. 7B depicts programming of a lower page of data. If the lower page has a bit=1, the associated storage element remains in the distribution 700 and the data is represented by x1, where x is an upper page bit that is not yet known. If the lower page has a bit=0, the storage element is programmed to a higher Vth as represented by distribution 702, which is an interim distribution (INT), using a verify level VINT_pv. The data of these storage elements is represented by x0. Note that the interim distribution can be relatively wide since it is not a final distribution and does not represent a final data state.

FIG. 7C depicts programming of an upper page of data. If UP/LP=11, the associated storage element in the distribution 700 remains in the distribution 700 and stores data bits 11. If UP/LP=01, the storage elements in the distribution 700 are programmed to the distribution 704. If UP/LP=10, the storage elements in the distribution 702 are programmed to the distribution 708. If UP/LP=00, the storage elements in the distribution 702 are programmed to the distribution 706. The example read levels and program-verify levels discussed previously are also depicted. Programming can be similarly extended to three or more bits per storage element.

Figure 8:
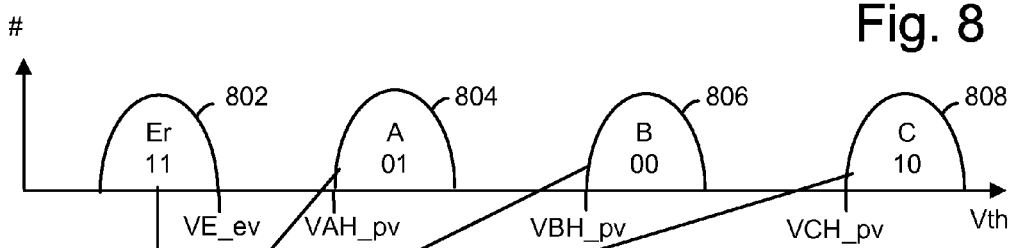
FIGS. 8 and 9 depict Vth distributions of memory cells in an erase operation, in accordance with FIG. 4F.
Figure 9:

FIGS. 8 and 9 depict Vth distributions of memory cells in an erase operation, in accordance with FIG. 4F. During an erase operation, the Vth distributions 804, 806 and 808 transition to the erase state distribution 802, using the erase-verify level VE_ev. In one approach, all of the storage elements in one or more NAND strings are subject to an erase-verify test concurrently, while VE_ev is applied to their control gates. If a NAND string is conductive, it passes the test.

Figure 10:
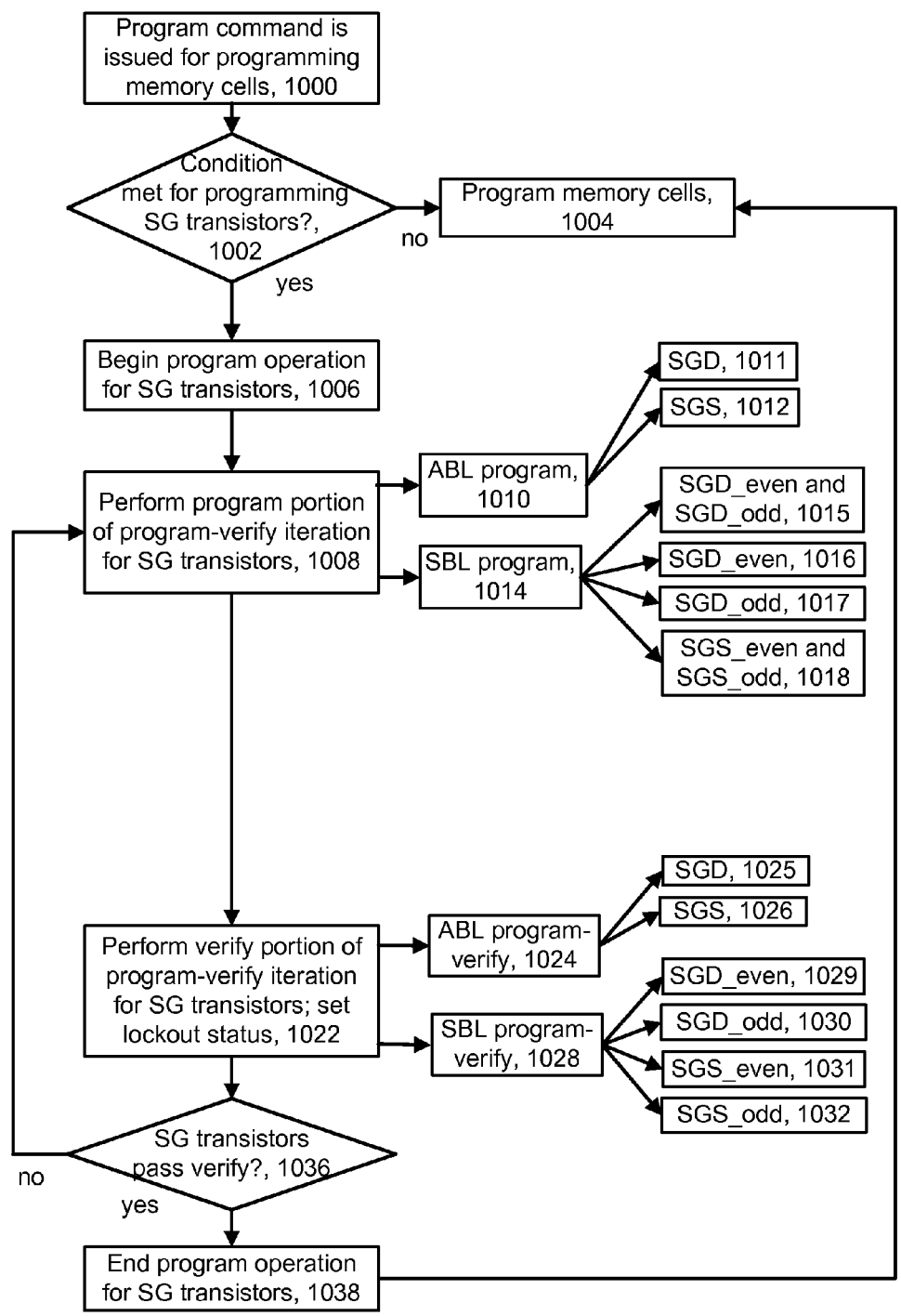
FIG. 10 depicts a flowchart of a process for programming select gate transistors in connection with the programming of memory cells, in accordance with FIG. 4F.

FIG. 10 depicts a flowchart of a process for programming select gate transistors in connection with the programming of memory cells, in accordance with FIG. 4F. At step 1000, a program command is issued for programming memory cells such as on a selected word line. Decision step 1002 determines if a condition is met for programming select gate transistors. A separate decision can be made for SGD and SGS transistors, in one approach. In another approach, if an SBL configuration is used, a separate decision can be made for SG transistors of even- and odd-numbered NAND strings.

The determining that the condition is met for erasing a SG transistor (a first select gate transistor) can comprise determining that a threshold voltage of the first select gate transistor exceeds an upper bound (e.g., Vsgd_max_r) of an acceptable range (e.g., Vsgd_min_r to Vsgd_max_r) of threshold voltages.

One implementation of the decision step is to perform one or more read operations. For example, in the case of SGD transistors, a read operation using Vsgd_min_r can identify a number of SGD transistors for which the Vth is below an acceptable range (e.g., SGD transistors for which the Vth is in region 602 in FIG. 6A). If this number if above a specified number, the condition is met for programming the SGD transistors.

Another implementation of the decision step is to determine whether a specified time period (e.g., in days or months) has elapsed since a last programming of the select gate transistors. If the specified time has passed, the condition is met for programming the SGD transistors. This approach is based on the theory that the Vth can shift gradually over time.

Another implementation of the decision step is to determine whether a specified temperature history of the non-volatile storage device has occurred in a specified time period. A temperature history can be maintained by periodically recording the ambient temperature of the memory device. The temperature history can be evaluated in terms of a condition involving a maximum temperature recorded, a time period in which the temperature is above a specified level and so forth.

Another implementation of the decision step is to determine whether a count of program-erase cycles exceeds a threshold count for a block in which the NAND string is located.

Various other conditions, or combinations of conditions, can be used.

If decision step 1002 is false, step 1004 programs the memory cells and the select gate transistors are not programmed at this time.

If decision step 1002 is true, step 1006 begins a programming operation for the select gate transistors. Step 1008 performs the program portion of a program-verify iteration in which the select gate transistors are programmed. Typically this involves apply a program pulse to control gates of the select gate transistors via one or more control lines such as SGD, SGD_even, SGD_odd, SGS, SGS_even and/or SGS_odd. Further, this can involve programming in the ABL configuration (step 1010), where programming of SGD transistors (step 1011) or SGS transistors (step 1012) occurs. If both are to be programmed, they can be programmed separately. For example, the SGD transistors can be programmed and then the SGS transistors. Another approach involves programming in the SBL configuration (step 1014), where concurrent programming of SGD_even and SGD_odd transistors occurs (step 1015), separate programming of SGD_even transistors occurs (step 1016), separate programming of SGD_odd transistors occurs (step 1017), or concurrent programming of SGS_even and SGS_odd transistors occurs (step 1018). For SGD programming, step 1015, 1016 and/or 1017 can be selected.

Step 1022 performs the verify portion of the program-verify iteration for the select gate transistors, and sets a corresponding lockout status.

For ABL programming, the select gate transistors that pass the program-verify test can have a lockout status set to true (lockout) so that they are inhibited from being further programmed in the next program-verify iteration (e.g., in step 1008) and in a remainder of the programming operation. A select gate transistor can be inhibited from being programmed by setting the bit line voltage of the associated NAND string to a high level (e.g., Vdd). The select gate transistors that do not pass the program-verify test have a lockout status kept at false (no lockout) so that they can be further programmed in the next program-verify iteration (e.g., in step 1008). A select gate transistor can be configured to allow programming by setting the bit line voltage of the associated NAND string to a low level (e.g., 0 V). A lockout status can be maintained for each select gate transistor in the latches associated with the sense blocks, in one approach. ABL programming with lockout thus results in tightening of the natural Vth distribution of the select gate transistors.

In contrast, some SBL programming techniques may not allow lockout which results in tightening of the natural Vth distribution of the select gate transistors. Instead, when lockout is not used, the natural Vth distribution is shifted rather than tightened. Lockout is not used due to sharing of the bit line, in one approach. However, the natural Vth distribution is expected to be sufficiently narrow since the select gate transistor is a long channel device. With no lockout of the NAND strings, there is no boosting of the NAND strings by pass voltages of the word lines. Thus, a lower Vpass can be used for select gate programming compared to memory cell programming (e.g., 4 V vs. 7 V). This reduces the likelihood of Vpass disturb (inadvertent programming) of the memory cells, where a high Vpass can act as a programming voltage.

Step 1022 typically involves applying a verify pulse to control gates of the select gate transistors via one or more control lines such as SGD, SGD_even, SGD_odd, SGS, SGS_even and/or SGS_odd and sensing whether the select gate transistors are in a conductive state. A lockout status can be set to true for select gate transistors which are in conductive state so that they need not be programmed or verified in a next iteration. Another possible sensing technique adjusts the sensing time and/or current trip level to determine whether the Vth of a select gate transistor is above or below a certain voltage level.

The verifying can involve the ABL configuration (step 1024), where verifying of SGD transistors (step 1025) or SGS transistors (step 1026) occurs. If both are to be verified, they can be verified separately. For example, the SGD transistors can be verified and then the SGS verified. Another approach involves verifying in the SBL configuration (step 1028), where the SGD_even transistors are verified at step 1029 and/or the SGD_odd transistors are separately verified at step 1030. Or, the SGS_even transistors are verified at step 1031 and/or the SGS_odd transistors are separately verified at step 1032.

Decision step 1036 determines if the set of select gate transistors pass the verify test. For example, the set can pass when all or most of the select gate transistors in the set pass the verify test. As an example, the set can be all SGD transistors in a block. If decision step 1036 is true, the programming operation ends for the select gate transistors at step 1038. Programming of the memory cells can then begin at step 1004. This can involve repeated program-verify iterations similar to those discussed in connection with programming of the select gate transistors. See also FIG. 14. If decision step 1036 is false, the program portion of the next program-verify iteration occurs at step 1008.

Details of specific programming techniques for the select gate transistors are discussed below.

Figure 11:
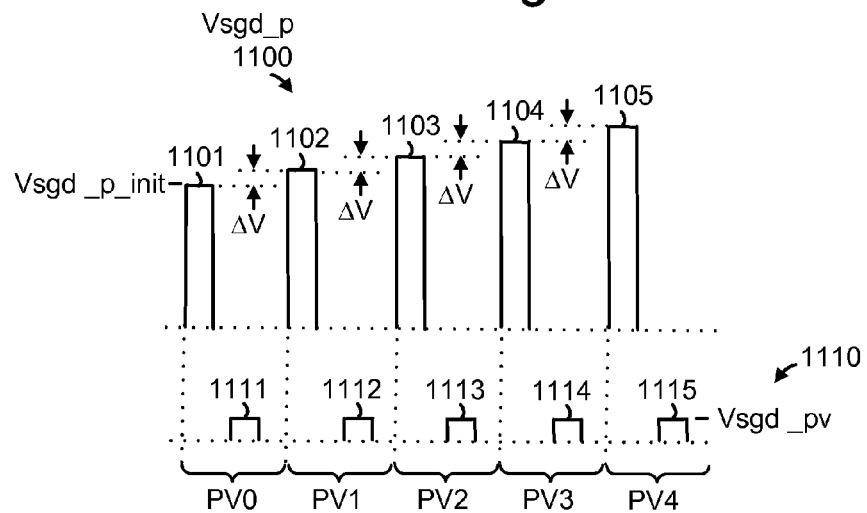
FIG. 11 depicts waveforms in an example of a programming operation for SGD transistors in accordance with steps 1011 and 1025 of FIG. 10.

FIG. 11 depicts waveforms in an example of a programming operation for SGD transistors in accordance with steps 1011 and 1025 of FIG. 10. Example program-verify iterations PV0, PV1, PV2, PV3 and PV4 are depicted. Each program-verify iteration includes a program portion and a verify portion. The program portion typically applies a program pulse to the control gates of the select gate transistors. An initial value of the program pulses is Vsgd_p_init. The verify portion involves performing a sensing operation to determine if the Vth of the select gate transistors is below a program-verify voltage. Typically, the program-verify voltage is applied to the control gates of the select gate transistors and the conductive or non-conductive state is sensed to make this determination.

Note that the programming and erase behavior of select gate transistors can differ from that of memory cells so that they may program or erase at a faster or slower speed than memory cells. Moreover, different program or erase amplitudes and/or step sizes may be more suitable for select gate transistors than for memory cells. Also, the verify levels can different between the select gate transistors and memory cells. With these variables, the number of program-verify iterations needed to program the select gate transistors and memory cells can differ, and the number of program-erase iterations needed to erase the select gate transistors and memory cells can differ.

The waveform 1100 depicts program pulses 1101, 1102, 1103, 1104 and 1105 which are applied to the control gates of the SGD transistors, and which increase by a fixed step size $\Delta V$. A generic amplitude of the program pulses is Vsgd_p. The waveform 1110 depicts program-verify pulses 1111, 1112, 1113, 1114 and 1115 which are applied to control gates of the SGD transistors. A generic amplitude of the program-verify pulses is Vsgd_pv. Thus, after each program pulse, a program-verify test occurs.

The approach here can alternatively be used for SGS transistors in which case the program pulses are applied to the control gates of the SGS transistors.

Figure 12:
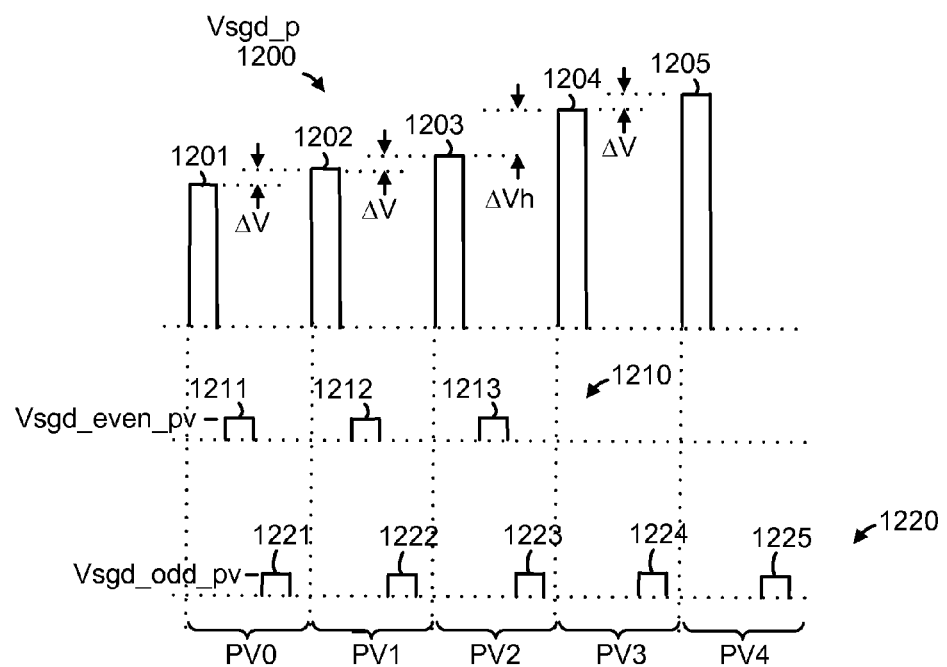
FIG. 12 depicts waveforms in an example of a programming operation for SGD transistors in accordance with steps 1015, 1029 and 1030 of FIG. 10.

FIG. 12 depicts waveforms in an example of a programming operation for SGD transistors in accordance with steps 1015, 1029 and 1030 of FIG. 10. Here, the SGD_even transistors are verified separately (before or after) from the SGD_odd transistors.

The waveform 1200 depicts program pulses 1201, 1202, 1203, 1204 and 1205 which are concurrently applied to the control gates of the SGD_even and SGD_odd transistors, and which increase by a fixed step size $\Delta V$. The waveform 1210 depicts program-verify pulses 1211, 1212 and 1213, which are applied to control gates of the SGD_even transistors. A generic amplitude of these program-verify pulses is Vsgd_even_pv. The waveform 1220 depicts program-verify pulses 1221, 1222, 1223, 1224 and 1225 which are applied to control gates of the SGD_odd transistors. A generic amplitude of these program-verify pulses is Vsgd_odd_pv which can be the same as, or different than, Vsgd_even_pv. Thus, after each program pulse in PV0-PV2, a program-verify test occurs for the SGD_even transistors and then for the SGD_odd transistors. The approach here can alternatively be used for SGS transistors associated with even- and odd-numbered NAND strings if such SGS transistors were separately controllable in the way the SGD_even and SGD_odd transistors are separately controllable.

In this example, the SGD_even transistors complete programming in PV2, before the SGD_odd transistors complete programming in PV4. This can occur due to different programming speeds of SGD_even vs. SGD_odd transistors. Once SGD_even transistors complete programming, Vpass is applied to their control gates for the subsequent program pulses. A result of this is that the SGD_odd transistors can experience a reduced programming effect on the initial PV iteration (e.g., PV3) after the SGD_even transistors complete programming due to the reduced voltage on the SGD_even transistors. Specifically, during PV0-PV2, the SGD_even transistors receive a relatively high program voltage Vsgd_p (e.g., 12 V or more). During PV3, the SGD_even transistors receive a relatively low pass voltage Vpass (e.g., 7 V or more). This change in voltage can result in a reduced programming effect on the SGD_odd transistors in PV3. The reduced programming effect is mostly gone by PV4. To counteract the reduced programming effect and thereby avoid slowing of the programming operation, a higher step size $\Delta Vh$ can be used in PV3. The normal step size $\Delta V$ can be used in PV4 and later PV iterations.

Thus, if the select gate transistors of the even-numbered NAND strings complete programming before the select gate transistors of the odd-numbered NAND strings complete programming, or the select gate transistors of the odd-numbered NAND strings complete programming before the select gate transistors of the even-numbered NAND strings complete programming, an increased step up ($\Delta Vh$) can be used for the program pulse in an immediately next program-verify iteration.

The SGD_even and SGD_odd transistors are expected to have the same characteristics (same Vth, same erase/program speed), on average. However, they may have slightly different characteristics, on average, due to variations in the net implant dose that they receive, so that they erase/program at slightly different rates. To compensate for such differences, the control gate biases can differ for the SGD_even and SGD_odd transistors during programming or erase. For example, if the SGD_even transistors program faster than the SGD_odd transistors, a reduced program voltage can be used for the SGD_even transistors. If the SGD_even transistors erase faster than the SGD_odd transistors, a higher control gate voltage can be used for the SGD_even transistors during erase, as discussed further below.

PV0-PV2 can be considered to be one or more initial PV iterations and PV3 and PV4 can be considered to be one or more additional PV iterations in a programming operation.

FIG. 13 depicts waveforms in an example of a programming operation for SGD transistors in accordance with steps 1016, 1017, 1029 and 1030 of FIG. 10. Here, the SGD_even transistors and SGD_odd transistors receive separate program pulses which could be of the same or different amplitudes and/or step sizes. Moreover, the SGD_even transistors are verified separately (before or after) from the SGD_odd transistors.

The waveform 1300 depicts program pulses 1301, 1302, 1303, 1304 and 1305 which are applied to the SGD_even transistors but not the SGS_odd transistors, and program pulses 1306, 1307, 1308 and 1309 which are applied to the SGD_odd transistors but not the SGS_even transistors. An initial value of the program pulses is Vsgd/s_p_init, but could be different for the SGD and SGS transistors.

The waveform 1310 depicts program-verify pulses 1311, 1312, 1313, 1314 and 1315 which are applied to control gates of the SGD_even transistors. The waveform 1320 depicts program-verify pulses 1321, 1322, 1323 and 1324 which are applied to control gates of the SGD_odd transistors. Thus, after each of the program pulses in PV0-PV3 (in a first programming phase PH1), a program-verify test occurs for the SGD_even transistors and then for the SGD_odd transistors. In the program pulse in PV4 (in a second programming phase PH2), a program-verify test occurs for the SGD_even transistors but not for the SGD_odd transistors. In this example, the SGD_odd transistors complete programming after PV3 so that no additional program pulse for them is used in PV4.

PV0-PV3 can be considered to be one or more initial PV iterations and PV4 can be considered to be one or more additional PV iterations.

Generally, when SGD_even receives the program voltage (Vsgd_p), SGD_odd receives a pass voltage (Vpass). When SGD_odd receives the program voltage, SGD_even receives a pass voltage.

With ABL programming, the select transistors that pass the verify-test can be inhibited/locked out from further programming by applying Vdd to their bit lines. The technique of FIG. 13 allows lockout of the select transistors that pass the program-verify test even with SBL programming because one NAND string at a time is programmed, for each pair of NAND strings connected to a shared bit line. For the select transistors that did not yet pass the program-verify test, 0 V can be applied to the bit line.

When a memory cell on a NAND string is inhibited from programming, its associated bit line is set to Vdd to shut off the SGD associated with the NAND string. This cuts off the channel associated with the NAND string, floating the channel and enabling the channel potential to be boosted. However, when a SGD transistor is inhibited, even when Vdd is applied to a bit line, the corresponding channel underneath the SGD transistor typically will not be floated because Vdd is typically not sufficiently high to render the SGD transistor in a non-conductive state. As a result, the channel under the SGD transistor will continue to be in direct contact with the bit line and not cut off from the bit line. Thus, the channel potential under the SGD transistor, for the NAND strings which have Vdd applied to their bit lines, will be about the same as Vdd (~2.5V). This situation applies to both the SBL and ABL cases. Although this channel potential is smaller than the boost potential (~6-7 V) which is reached for memory cell programming, it is likely sufficient to inhibit inadvertent programming of the select gate transistors.

The double programming pulse technique of FIG. 13 can be slower than single programming pulse techniques such as in FIGS. 11 and 12 since SGD_even and SGD_odd are programmed separately. One solution is to combine the single programming pulse and double programming pulse techniques in the same program sequence/operation. For example, for one or more initial program pulses, the single programming pulse technique can be used where SGD_even and SGD_odd transistors are programmed concurrently, such as in FIG. 12. When the Vth of a certain portion (e.g., 50%) of the SGD_even and/or SGD_odd transistors crosses a target verify level, or after a specified number of program-verify iterations, the double programming pulse technique can be used, such as in FIG. 13. The program pulse can continue stepping up in the transition to the double programming pulse technique rather than restarting from an initial level. This hybrid programming technique can result in similarly tight Vth distributions but at a reduced programming time, compared to using the double programming pulse technique throughout the programming operation.

In a further extension to the programming techniques for select gate transistors (including the techniques of FIGS. 11-13), QPW can be used to improve the programmed Vth distributions of the select gate transistors, as mentioned in connection with FIG. 6C. Under QPW, two program-verify tests can be performed: one at the lower program-verify level, Vsgd_pvL and one at the higher program-verify level, Vsgd_pv. Select gate transistors with Vth<Vsgd_pvL will be programmed under the standard (faster) programming mode using Vbl=0 V. Select gate transistors with Vsgd_pvL<Vth<Vsgd_pv will be programmed under the QPW (slower) programming mode using Vbl=~0.8V, for instance. Select gate transistors with Vth>Vsgd_pv will be inhibited from further programming using Vbl=Vdd. Optionally, a transition to using the QPW mode is made after the Vth of a certain portion (e.g., 50%) of the SGD_even and/or SGD_odd transistors crosses a target verify level, or after a specified number of program-verify iterations.

Another alternative to FIG. 13 is to program and verify the SGD_even transistors while the SGD_odd transistors receive Vpass on their control gates, until programming is complete for the SGD_even transistors. Then, the SGD_odd transistors are programmed and verified.

Another alternative is to program and verify the SGD_odd transistors while the SGD_even transistors receive Vpass on their control gates, until programming is complete for the SGD_odd transistors. Then, the SGD_even transistors are programmed and verified.

The approaches here can alternatively be used for SGS transistors associated with even- and odd-numbered NAND strings if such SGS transistors were separately controllable in the way the SGD_even and SGD_odd transistors are separately controllable.

As a further note, the programming techniques described can use different programming mechanisms. Programming which involve an increasing control gate voltage typically uses the Fowler-Nordheim-tunneling mechanism. Another possible programming mechanism is channel-hot electron injection.

Figure 14:
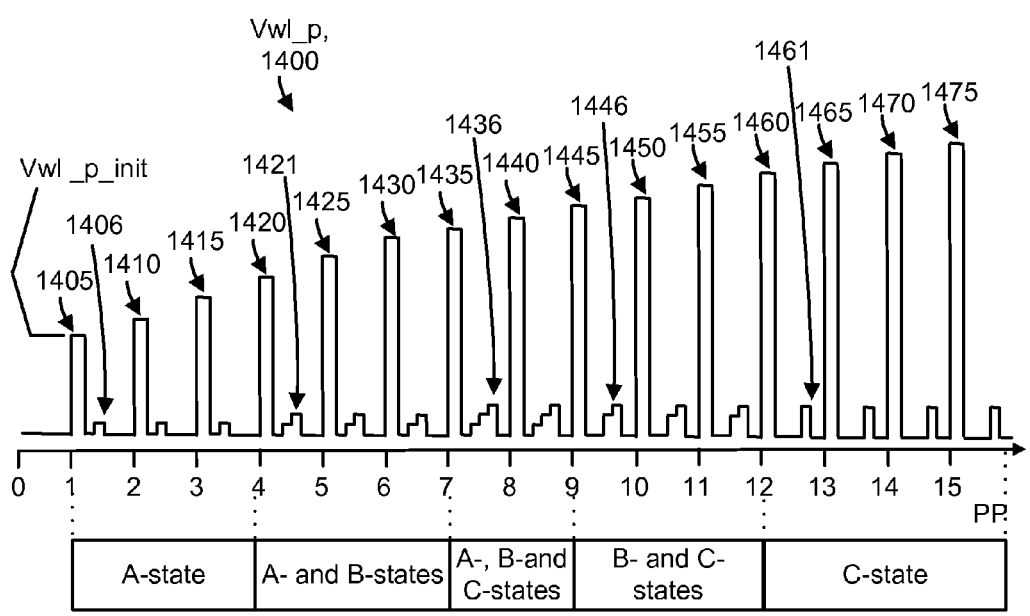
FIG. 14 depicts programming of memory cells in accordance with step 1004 of FIG. 10.

FIG. 14 depicts programming of memory cells in accordance with step 1004 of FIG. 10. In this example, verify operations are performed for different target data states as the programming operation progresses. The horizontal axis depicts program pulse (PP) number and the vertical axis depicts control gate or word line voltage. Generally, a programming operation can involve applying a pulse train to a selected word line, where the pulse train includes multiple program-verify iterations. The program portion of the program-verify iteration comprises a program pulse, and the verify portion of the program-verify iteration comprises one or more verify pulses.

Note that a program pulse can have any number of different waveform shapes. A square waveform is depicted, although other shapes are possible such as a multilevel shape or a ramped shape. A pulse train typically includes program pulses which increase stepwise in amplitude, typically using a fixed step size, although a varying step size can be used as well. A new pulse train can be applied in each programming pass of a multi-pass programming operation, starting at an initial level and ending at a final level which does not exceed a maximum allowed level. A generic word line voltage is referred to as Vwl_p.

The pulse train 1400 includes a series of program pulses 1405, 1410, 1415, 1420, 1425, 1430, 1435, 1440, 1445, 1450, 1455, 1460, 1465, 1470 and 1475 that are applied to a word line selected for programming, and to an associated set of non-volatile storage elements. An initial value of the program pulses is Vwl_p_init. One, two or three verify levels are provided after each program pulse as an example, based on the target data states which are being verified. 0 V may be applied to the selected word line between the program and verify pulses. For example, an A-state verify pulse (e.g., waveform 1406) may be applied after each of the $1^{st}$-$3^{rd}$ program pulses 1405, 1410 and 1415, respectively. A- and B-state verify pulses (e.g., waveform 1421) may be applied after each of the $4^{th}$-$6^{th}$ program pulses 1420, 1425 and 1430, respectively. A-, B- and C-state verify pulses (e.g., waveform 1436) may be applied after each of the 7th and 8th program pulses 1435 and 1440, respectively. B- and C-state verify pulses (e.g., waveform 1446) may be applied after each of the 9th-11$^{th}$ program pulses 1445, 1450 and 1455, respectively. Finally, a C-state verify pulse (e.g., waveform 1461) may be applied after each of the 12th-15th program pulses 1460, 1465, 1470 and 1475, respectively.

FIG. 15A depicts voltages during programming of SGD and SGS transistors in an ABL configuration in accordance with steps 1011 and 1012, respectively, of FIG. 10. For programming of the a SGD transistor (column 1), the bit line (BL) voltage is typically 0 V to allow full speed programming of the transistor, although for some NAND strings this voltage could be a small non-zero value, e.g., 0.8 V, to provide slow programming, such as in a quick pass write mode for the transistors. Bit lines of inhibited select gate transistors are biased at Vdd. The SGD control gate voltage is Vsgd_p which can be the step-wise increasing program voltage discussed. The WLDD, WL0-WL63 and WLDS voltages can be Vpass, a pass voltage such as 7 V which is sufficient to provide the associated storage elements in a conductive state. Optionally, different voltages can be used on different word lines to assist in the programming of the select gate transistors. For example, a higher pass voltage can be used on the dummy word line (e.g., WLDD) which is closest to the SGD transistor to assist in the programming of the SGD transistor.

With its control gate at 0 V and the source line (SL) at Vsl, e.g., 2V, the SGS transistor has a relatively high back bias which helps maintain it in the non-conductive state. The Vpass values used during programming can be the same or different for the select gate transistors and memory cells. The Vpass values can be the same or different for SGD and SGS transistors. The Vpass values can be the same or different for the dummy and non-dummy memory cells.

For programming of a SGS transistor (column 2), the voltages can be similar as for the case of programming a SGD transistor, except the SGS voltage is Vsgs_p which can be the step-wise increasing program voltage discussed. Also, the SL voltage can be set to 0 V, the same as the bit line voltage, to maintain the channel at 0 V. In contrast, for programming of the SGD transistor or the memory cell, Vsl is set high to cut off the SGS transistor, and the value of Vsl does not affect the channel potential. However, during programming of the SGS transistor, Vsl is passed on to the channel, so it should be set at 0 V to enable programming of the SGS transistor. This is true for both SBL and ABL programming. Also, the SGS transistor cannot be inhibited, unlike the SGD transistor.

The SGD transistor is in a conductive state with its control gate at Vpass and Vbl=0 V.

This pass voltage for programming of SGD or SGS transistors can be lower than a pass voltage which is used during programming of storage elements since there is no reason to boost a channel region. Specifically, during programming of the SGD transistors, these transistors are in a conductive state. In contrast, during programming of storage elements, the SGD transistors are in a non-conductive state for inhibited NAND strings, and the pass voltages are used to boost the potential of a channel region of the inhibited NAND strings by capacitive coupling. In this case, a higher Vpass of, e.g., 9 V might be used.

FIG. 15B depicts voltages during programming of memory cells in an ABL configuration in accordance with step 1004 of FIG. 10. The bit line (BL) voltage is typically 0 V to allow full speed programming of the memory cells, although this voltage could be a small non-zero value, e.g., 0.8 V, to provide slow programming, such as in the quick pass write mode. The bit lines associated with the inhibited NAND strings are biased at Vdd. For the selected NAND string, Vsgd at the control gate of the SGD transistor maintains the transistor in a conductive state to allow programming of the respective NAND string. The WLDD, WL_unsel and WLDS voltages can be Vpass, e.g., 9 V, to provide the associated storage elements in a conductive state and to boost the channels of inhibited NAND strings. The WL_sel voltage is Vwl_p which can be the step-wise increasing program voltage discussed. For an inhibited NAND string in the ABL configuration, the SGD transistor will be in a non-conductive state with Vbl=Vdd (e.g., 2.5 V), for instance.

FIG. 15C depicts voltages during programming of SGD and SGS transistors in a SBL configuration in accordance with steps 1015-1018 of FIG. 10. The first column provides voltages for concurrent programming of SGD_even and SGD_odd transistors, where Vsgd_p is applied to both types of transistors. The second column provides voltages for separate programming of SGD_even transistors, where Vsgd_p is applied to the SGD_even but not the SGD_odd transistors. The third column provides voltages for separate programming of SGD_odd transistors, where Vsgd_p is applied to the SGD_odd but not the SGD_even transistors. The fourth column provides voltages for concurrent programming of SGS_even and SGS_odd transistors.

FIG. 15D depicts voltages during program-verify of SGD and SGS transistors in an ABL configuration in accordance with steps 1025 and 1026, respectively, of FIG. 10. The first column provides voltages for programming of a SGD transistor and the second column provides voltages for programming of a SGS transistor. The bit line is at a sense level, Vsense, e.g., 0.4 V above Vsl. In the first column, the SGD transistor is at the program-verify level of Vsgd_pv and the SGS transistors are at Vsg, e.g., 3.5 V, which provides them in a conductive state. In the second column, the SGS transistor is at the program-verify level of Vsgs_pv and the SGD transistors are at Vsg, which provides them in a conductive state.

WLDD, WL0-WL63 and WLDS are at Vread to provide the associated storage elements in a conductive state. The Vread values can be the same or different for the select gate transistors and memory cells. The Vread values can be the same or different for SGD and SGS transistors. The Vread values can be the same or different for the dummy and non-dummy memory cells.

FIG. 15E depicts voltages during program-verify of memory cells in an ABL configuration in accordance with step 1004 of FIG. 10. The SGD and SGS transistors are in a conductive state due to Vsg on their control gates. WLDD, WL_unsel and WLDS are at Vread to provide the associated storage elements in a conductive state. WL_sel is at a generic program-verify level referred to as VxL/H_pv.

FIG. 15F depicts voltages during program-verify of SGD and SGS transistors in a SBL configuration in accordance with steps 1029-1032 of FIG. 10. The first column provides voltages for a separate program-verify of SGD_even transistors, where Vsgd_even_pv is applied to the SGD_even transistors and 0 V is applied to the SGD_odd transistors. Applying 0 V to SGD_odd transistors shuts them off such that no current flows through the odd-numbered NAND strings and thus only SGD_even transistors are sensed. When sensing the SGD_even transistors, 0 V is applied to the SGS_odd transistors to render them non-conductive so that current does not flow in the of odd-numbered NAND strings, interfering with the sensing of the even-numbered NAND strings.

The second column provides voltages for a separate program-verify of SGD_odd transistors, where Vsgd_odd_pv is applied to the SGD_odd transistors and 0 V is applied to the SGD_even transistors. When sensing the SGD_odd transistors, 0 V is applied to the SGS_even transistors to render them non-conductive so that current does not flow in the even-numbered NAND strings, interfering with the sensing of the odd-numbered NAND strings.

The third column provides voltages for a program-verify of SGS_even/odd transistors, where Vsgs_pv is applied. Vsg renders the SGD_even transistors and SGD_odd transistors in a conductive state to allow sensing of the SGS_even/odd transistors.

In all columns, the memory cells associated with WLDD, WL0-WL63 and WLDS are provided in a conductive state by Vread. Vsg provides a select gate transistor in a conductive state.

FIG. 15G depicts voltages during program-verify of memory cells in a SBL configuration in accordance with steps 1004 of FIG. 10. The first column provides voltages for a separate program-verify of MC_even memory cells (memory cells in even-numbered NAND strings), where V×L/H_pv is applied to the memory cells via WL_sel. The SGD_even transistors are provided in a conductive state by Vsg. 0 V is applied to cutoff the SGD_odd transistors, to prevent the odd-numbered NAND strings from conducting any current. The second column provides voltages for a separate program-verify of MC_odd memory cells (memory cells in odd-numbered NAND strings), where V×L/H_pv is applied to the memory cells via WL_sel. The SGD_odd transistors are provided in a conductive state by Vsg. 0 V is applied to cutoff the SGD_even transistors to prevent the even-numbered NAND strings from conducting any current. In both columns, the memory cells associated with WLDD, WL_unsel and WLDS are provided in a conductive state by Vread, e.g., 8 V. The SGS_even and SGS_odd transistors are provided in a conductive state by Vsg.

Figure 16:
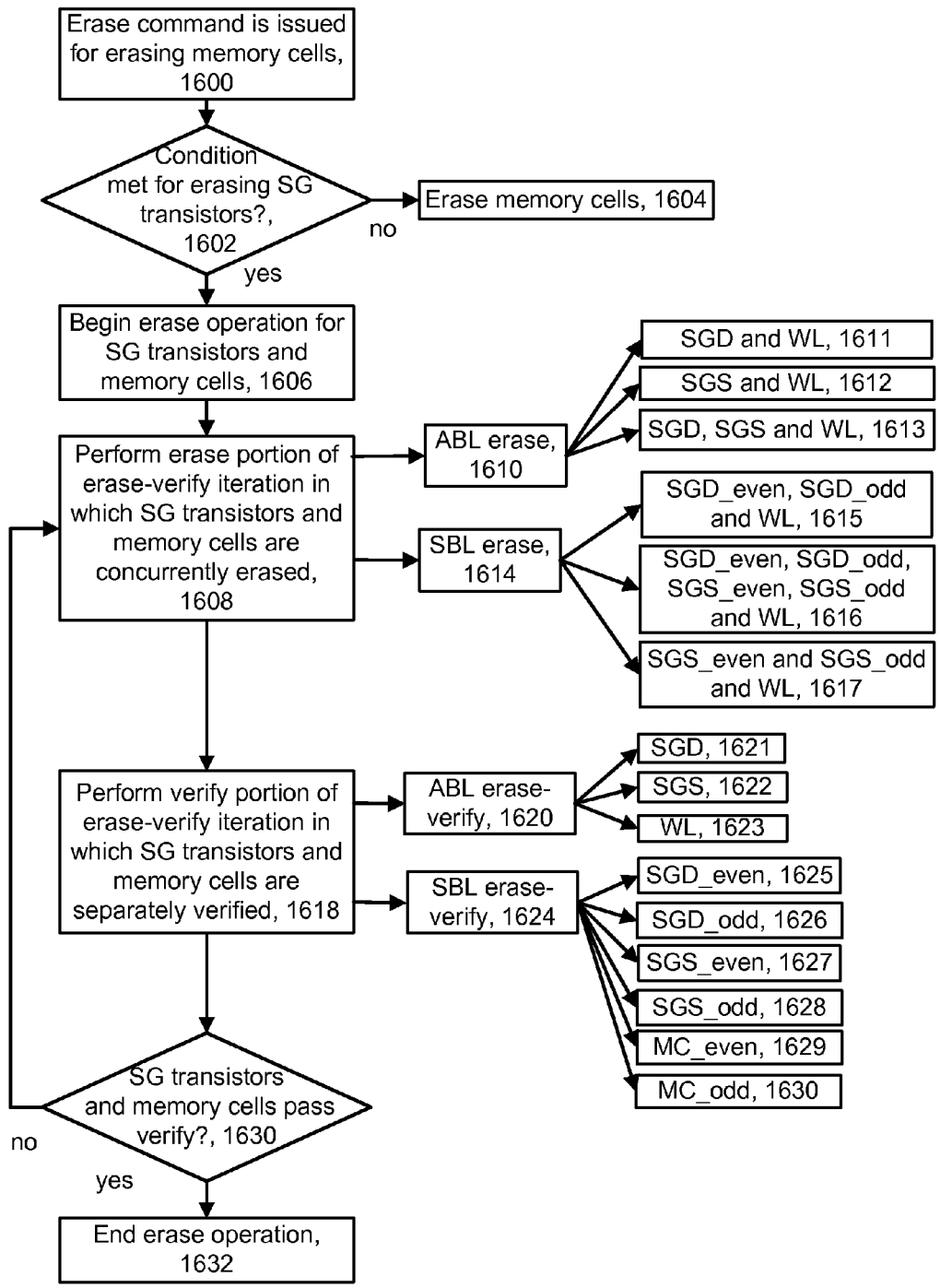
FIG. 16 depicts a flowchart of a process for erasing select gate transistors in connection with the erasing of memory cells, in accordance with FIG. 4F.

FIG. 16 depicts a flowchart of a process for erasing select gate transistors in connection with the erasing of memory cells, in accordance with FIG. 4F. At step 1600, an erase command is issued for erasing memory cells. A decision step 1602 determines if a condition is met for erasing select gate transistors. The conditions can be similar to those discussed in connection with FIG. 10 at step 1002, for instance. For example, determining that the condition is met for erasing the select gate transistor can comprise determining that a specified time period has elapsed since a last erase of the select gate transistors and/or determining a temperature history of the non-volatile storage device in the specified time period. The temperature history can be evaluated in terms of a condition involving a maximum temperature recorded, a time period in which the temperature is above a specified level and so forth.

If decision step 1602 is false, the memory cells are erased at step 1604 without erasing the select gate transistors.

If decision step 1602 is true, step 1606 begins an erase operation for select gate transistors and memory cells. Step 1608 involves performing the erase portion of an erase-verify iteration in which select gate transistors and memory cells are erased concurrently. One approach, at step 1610, involves an erase with an ABL configuration. The SGD transistors and memory cells can be erased concurrently (step 1611), the SGS transistors and memory cells can be erased concurrently (step 1612) or the SGD and SGS transistors and memory cells can be erased concurrently (step 1613). Another approach, at step 1614, involves an erase with an SBL configuration. The SGD_even, SGD_odd transistors and memory cells can be erased concurrently (step 1615), the SGD_even and SGD_odd transistors and memory cells can be erased concurrently (step 1616) or the SGS_even and SGS_odd transistors and memory cells can be erased concurrently (step 1617).

Step 1618 involves performing the verify portion of the erase-verify iteration in which the select gate transistors and memory cells are separately verified. One approach, at step 1620, involves an erase-verify with an ABL configuration. The SGD transistors can be erased-verified at step 1621, the SGS transistors can be erased-verified at step 1622 and/or the word lines/memory cells can be erased-verified at step 1623. Another approach, at step 1624, involves an erase-verify with an SBL configuration. The SGD_even transistors can be erased-verified at step 1625, the SGD_odd transistors can be erased-verified at step 1626, the SGS_even transistors can be erased-verified at step 1627, the SGS_odd transistors can be erased-verified at step 1628, the MC_even memory cells can be erased-verified at step 1629 and/or the MC_odd memory cells can be erased-verified at step 1630.

Decision step 1630 determines if the set of select gate transistors and memory cells pass their respective verify tests. For example, the set can pass when all or most of the select gate transistors in the set pass a respective verify test, and all or most of the memory cells in a set (e.g., block) pass a respective verify test. If decision step 1630 is true, the erase operation ends at step 1632. If decision step 1630 is false, the erase portion of the next erase-verify iteration occurs at step 1608.

Figure 17:
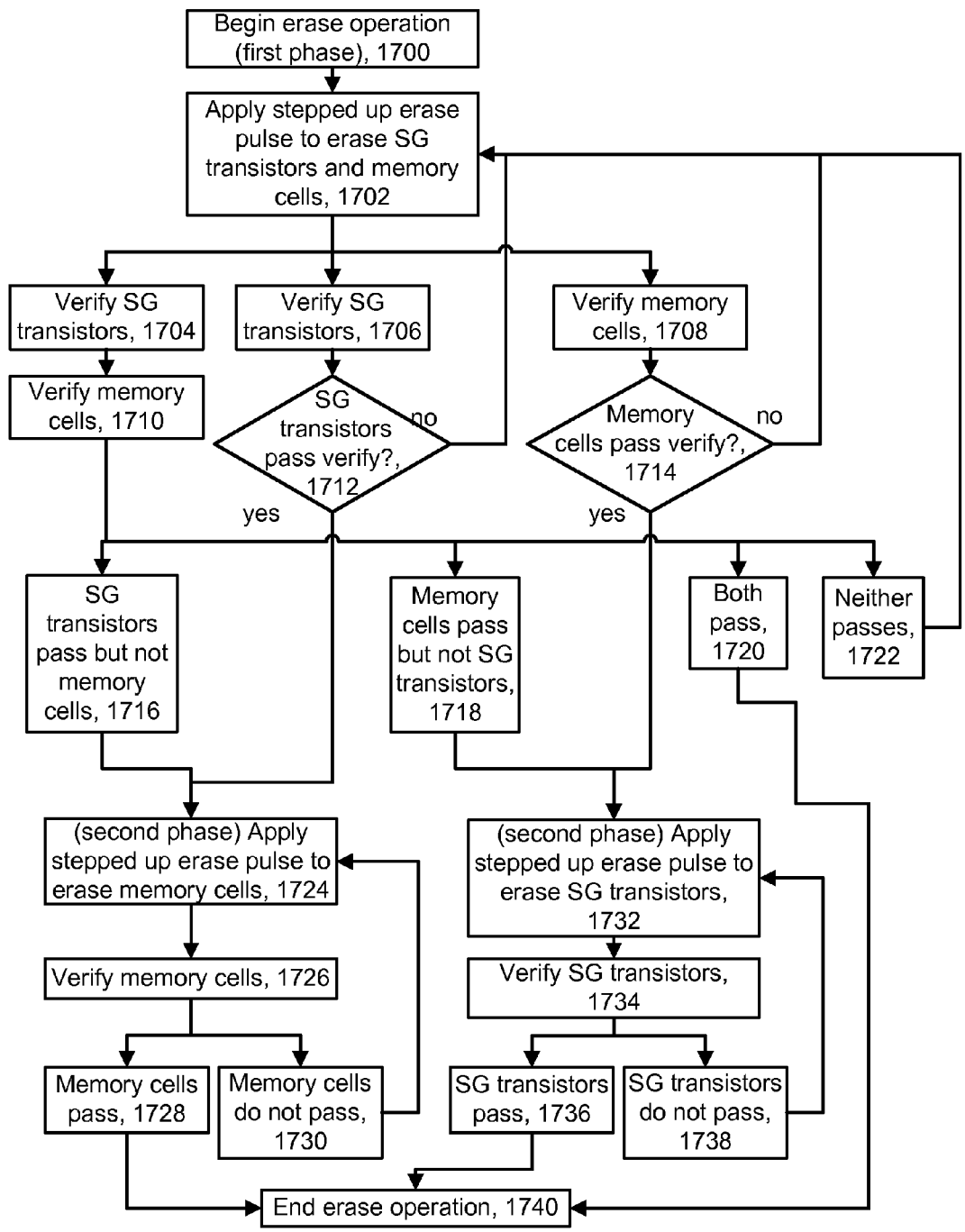
FIG. 17 depicts a flowchart of an example erase operation for memory cells and select gate transistors in accordance with steps 1608 and 1610 of FIG. 16.

FIG. 17 depicts a flowchart of an example erase operation for memory cells and select gate transistors in accordance with steps 1608 and 1610 of FIG. 16. A first phase of an erase operation begins at step 1700. Step 1702 involves applying a stepped up erase pulse to a substrate to erase the select gate transistors and memory cells. Subsequently, one of three branches is followed. In a first branch, the select gate transistors are verified (subject to a respective erase-verify test) at step 1704 and the memory cells are verified (subject to a respective erase-verify test) at step 1710. Subsequently, one of four sub-branches of the first branch can be followed.

In a first sub-branch (step 1716), the select gate transistors pass their respective erase-verify test but the memory cells do not pass their respective erase-verify test. In this case, a second phase of the erase operation begins at step 1724, where a next stepped up erase pulse is applied to the substrate to erase the memory cells. The select gate transistors can be inhibited from being erased by floating their control gate voltages or setting the control gate voltages to a relatively high level so that the substrate-to-gate voltage, and the corresponding erase effect, is relatively small. Step 1726 performs a further erase-verify test for the memory cells. The set of memory cells may pass the test (step 1728), after which the erase operation ends at step 1732. Or, the set of memory cells may not pass the test (step 1730), after which a further erase pulse is applied at step 1724.

In a second sub-branch, at step 1718, the memory cells pass their respective erase-verify test but the select gate transistors do not pass their respective erase-verify test. In this case, a second phase of the erase operation begins at step 1732, where a next stepped up erase pulse is applied to the substrate to erase the select gate transistors. The memory cells are inhibited from being erased by floating their control gate voltages. Step 1734 performs a further erase-verify test for the select gate transistors. The set of select gate transistors may pass the test (step 1736), after which the erase operation ends at step 1740. Or, the set of select gate transistors may not pass the test (step 1738), after which a further erase pulse is applied at step 1732.

In a third sub-branch, at step 1720, both the memory cells and the select gate transistors pass their respective erase-verify tests in the same erase-verify iteration, and the erase operation ends at step 1740.

In a fourth sub-branch (step 1722), neither the memory cells nor the select gate transistors pass their respective erase-verify tests. In this case, the first phase continues, and a further erase pulse is applied at step 1702.

In a second branch after step 1702, the select gate transistors are verified at step 1706. A decision step 1712 determines if the select gate transistors pass the erase-verify test. If decision step 1712 is false, the first phase continues, and a further erase pulse is applied at step 1702. If decision step 1712 is true, the second phase begin at step 1724 as discussed. This approach saves time because the memory cells are not verified until after the select gate transistors have passed their respective erase-verify test. This approach is suitable when the memory cells require more erase pulses and/or higher amplitude erase pulses than the select gate transistors to be erased.

In a third branch after step 1702, the memory cells are verified at step 1708. A decision step 1714 determines if the memory cells pass the erase-verify test. If decision step 1714 is false, the first phase continues, and a further erase pulse is applied at step 1702. If decision step 1714 is true, the second phase begin at step 1732 as discussed. This approach saves time because the select gate transistors are not verified until after the memory cells have passed their respective erase-verify test. This approach is suitable when the select gate transistors require more erase pulses and/or higher amplitude erase pulses than the memory cells to be erased.

Generally, the step size of the erase pulse can be different in the first and second phases. Further, an initial step size of the second phase can be larger than the step sizes in the first or second phases. This can help increase the erase speed in the second phase.

The erase-verify tests of steps 1704, 1706 and 1734 can involve verifying the SGD_even/odd transistors separately and/or verifying SGD and SGS transistors separately, if applicable. Example waveforms which illustrate some options for FIG. 17 are provided below.

Figure 18A:
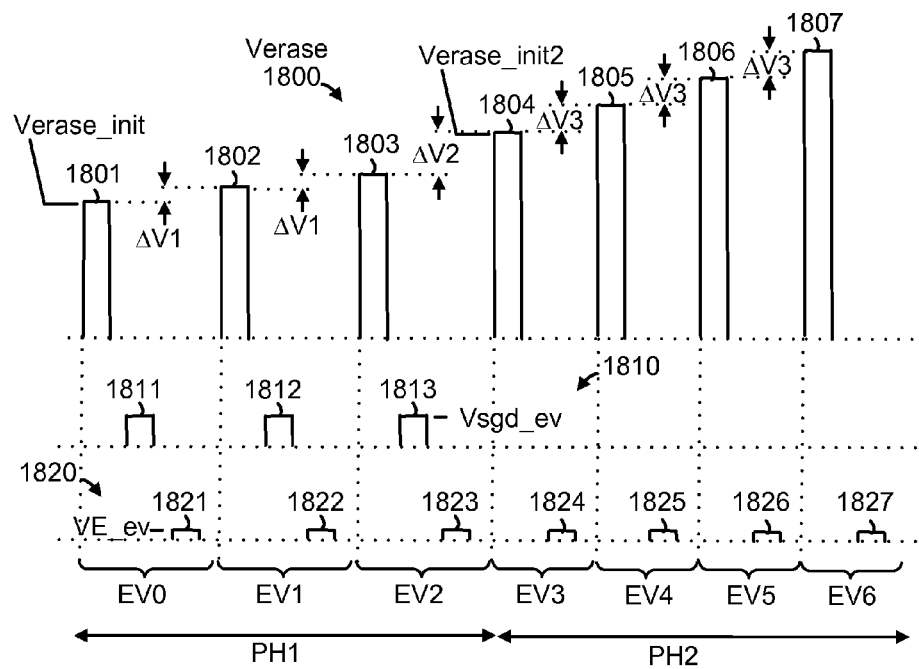
FIG. 18A depicts waveforms in an example of an erase operation for SGD transistors and memory cells in accordance with steps 1704, 1710, 1716, 1724 and 1726 of FIG. 17.

FIG. 18A depicts waveforms in an example of an erase operation for SGD transistors and memory cells in accordance with steps 1704, 1710, 1716, 1724 and 1726 of FIG. 17. In a typical erase operation for SGD transistors or memory cells, an erase voltage is applied to the substrate of the memory device, such as a p-well region of the substrate, in each erase portion of multiple erase-verify iterations. The erase voltage can be a positive voltage which is stepped up in amplitude with each erase-verify iteration. The control gates of the select gate transistors or memory cells to be erased can be held at a fixed voltage, while the control gates of the select gate transistors or memory cells which are inhibited from being erased can have a floating voltage.

A waveform 1800 represents a number of erase-verify iterations EV0-EV6. Each erase-verify iteration includes an erase pulse 1801-1807 in a set 1800 of pulses, followed by one or more verify pulses (i.e., erase-verify pulses). Verase_int is an initial value of the erase voltage applied to substrate. In this approach, there is an ABL configuration, and the SGD transistors and memory cells are erased and subject to an erase-verify test in each erase-verify iteration EV0-EV2 until the SGD transistors pass their respective erase-verify test in EV2. In the subsequent erase-verify iterations (e.g., EV3-EV6), the SGD transistors are inhibited from being erased while the memory cells continue to be erased until the memory cells pass their respective erase-verify test in EV6. The erase portion of the erase operation is consistent with step 1611 of FIG. 16 and the verify portion of the erase-verify iteration is consistent with steps 1621 and 1623 of FIG. 16.

Specifically, a set 1810 of pulses comprising erase-verify pulses 1811-1813 for the SGD transistors at a level Vsgd_ev are applied in EV0-EV2, and a set 1820 of pulses comprising erase-verify pulses 1821-1827 for the memory cells at a level VE_ev are applied in EV0-EV6. EV0-EV2 represent the first phase of FIG. 17, and EV3-EV6 represent the second phase of FIG. 17.

EV0-EV2 can be considered to be one or more initial EV iterations and EV3-EV6 can be considered to be one or more additional EV iterations.

The step size of the erase pulses is $\Delta V1$ in the first phase, $\Delta V2$ at a start of the second phase and $\Delta V3$ in the remainder of the second phase. As an example, $\Delta V2 > \Delta V3 > \Delta V1$. The starting amplitudes of the erase pulses in phases one and two can be about 12 V and 16 V, respectively. A step size ($\Delta V2$) of the erase voltage of an initial erase-verify iterations (EV3) of the one or more additional erase-verify iterations (e.g., EV3-EV6 in phase two) can be greater than a step size ($\Delta V1$) of erase voltages in one or more erase-verify iterations of phase one (e.g., EV0-EV2), and greater than a step size of subsequent erase-verify iterations (e.g., EV4-EV6) of the one or more additional erase-verify iterations (e.g., $\Delta V3$, the default step size of the one or more additional erase-verify iterations). The default step size for a set of erase pulses is used for after the first erase pulse in the set. Alternatively, phase two can use a predetermined initial erase voltage Verase_init2 regardless of the amplitude of the erase voltage when phase one ends.

For example, after erasing of the select gate transistors is complete, the memory cells may require a higher amplitude erase voltage to be applied to the substrate before their erasing is complete. The memory cells may be erased to a small degree in phase one (PH1) by the same erase pulses which are used to erase the select gate transistors. Subsequently, in phase two (PH2), the memory cells are erased to a larger degree by the higher-amplitude erase pulses. The large step $\Delta V2$ allows a larger voltage to be applied at the start of PH2 to begin a stronger erase of the memory cells, and the larger step $\Delta V3$ in PH2 versus $\Delta V1$ in PH1 continues the stronger erase of the memory cells.

Figure 18B:
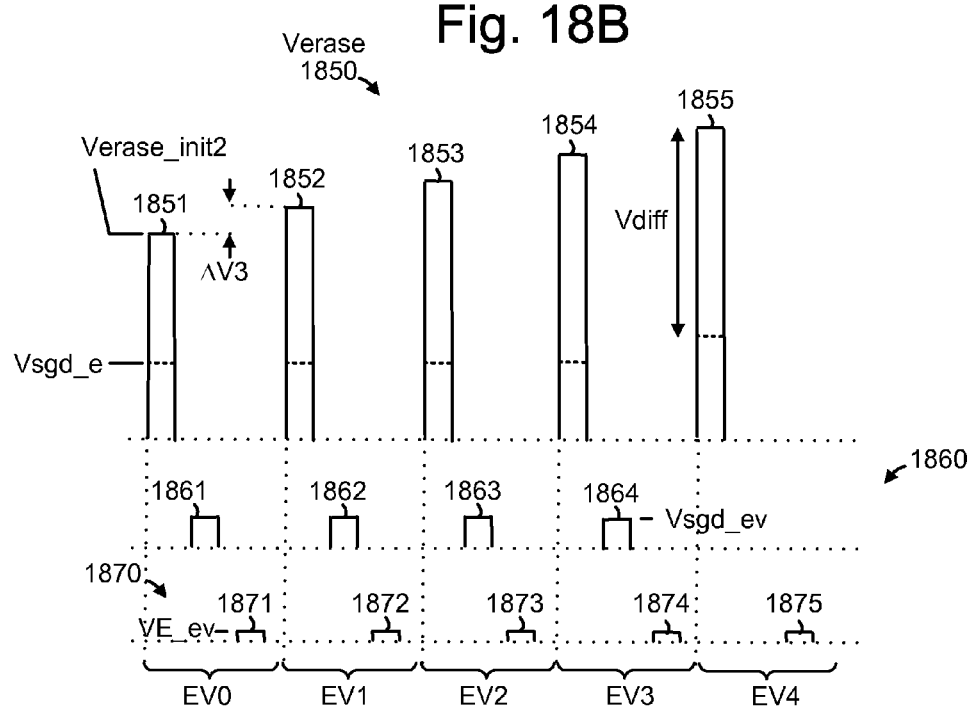
FIG. 18B depicts an alternative to FIG. 18A in which the erase speed of the SGD transistors and memory cells is roughly equalized.

FIG. 18B depicts an alternative to FIG. 18A in which the erase speed of the SGD transistors and memory cells is roughly equalized. In FIG. 18A, the erase of the SGD transistors was completed using relatively lower erase voltages applied to the substrate, and the erase of the memory cells used relatively higher erase voltages applied to the substrate. The total number of erase-verify iterations, and the total erase time, can be reduced by applying the relatively higher erase voltages to the substrate at a start of the erase operation, e.g., starting at Verase_int2. The memory cells are erased in fewer erase-verify iterations due to the higher starting voltages. The SGD transistors are erased in additional iterations than in FIG. 18A even with the higher erase pulses due to a higher control gate voltage than in FIG. 18A.

Specifically, to ensure that the SGD transistors are not over-erased and complete their erase at about the same erase-verify iteration, on average, as the memory cells complete their erase, a slow down measure can be imposed on the SGD transistors by raising their control gate voltages to a higher level, e.g., Vsgd_e=5 V, than in the example of FIG. 18A (where Vsgd_e=0.5 V). With a higher control gate voltage, the substrate-to-control gate voltage across the SGD transistor, and the corresponding erase effect, is reduced, for a given substrate voltage. The erase speed of the SGD transistors can thus be equalized with the erase speed of the memory cells. This approach can avoid the possibility of over-erase of either the select gate transistors or memory cells due to imperfect inhibiting of erase in phase two, such as in the case of FIG. 18A. Another option is for the erase speed of the SGD transistors to be equalized with the erase speed of the SGS transistors.

In one approach, Vsgd_e is fixed until the SGD transistor passes the verify test. Once it passes the verify test, further erase of the SGD transistor can be avoided by floating its control gate voltage or by stepping up Vsgd_e at ΔV3 with each additional erase pulse to maintain a constant difference (Vdiff) between Verase and Vsgd_e. In the example shown, the SGD transistor passes the verify test in EV3, so that Vsgd_e is stepped up in EV4. Vsgd_e can be fixed while the SGD transistor is being erased since it is expected that the SGD transistor will complete the erase before the memory cell. Thus, there is no need to accelerate the erase of the SGD transistor. Optionally, Vsgd_e could be stepped up while the SGD transistor is being erased.

Thus, the erase voltage and the control gate voltage of the SGD transistor (a first select gate transistor) can be stepped up in one or more erase-verify iterations.

A waveform 1850 represents a number of erase-verify iterations EV0-EV4. Each erase-verify iteration includes an erase pulse 1851-1855 in a set 1850 of pulses, followed by one or more verify pulses. Verase_int2 is the initial value of the erase voltage applied to the substrate. In one approach, as indicated by the dashed lines, after EV2, Vsgd_e is stepped up at the same rate as Verase in EV4, or in one or more subsequent erase-verify iterations after the SGD transistor completes programming, so that the difference between them (Vdiff) is fixed in the erase operation. The erase effect on the SGD transistor is constant when Vdiff is constant.

A set 1860 of pulses comprising erase-verify pulses 1861-1864 for the SGD transistors at a level Vsgd_ev are applied in EV0-EV3, and a set 1870 of pulses comprising erase-verify pulses 1871-1875 for the memory cells at a level VE_ev, are applied in EV0-EV4. The step size of the erase pulses can be ΔV3 as in phase two of FIG. 18A. The SGD transistors are considered to complete their erase at roughly the same time as the memory cells (e.g., EV3 vs. EV4).

In FIG. 18B, the control gate voltage of the SGD transistor (a first select gate transistor) is higher than the control gate voltage of the plurality of non-volatile storage elements so that a substrate-to-control gate voltage of the first select gate transistor is lower than a substrate-to-control gate voltage of the plurality of non-volatile storage elements.

Figure 19:
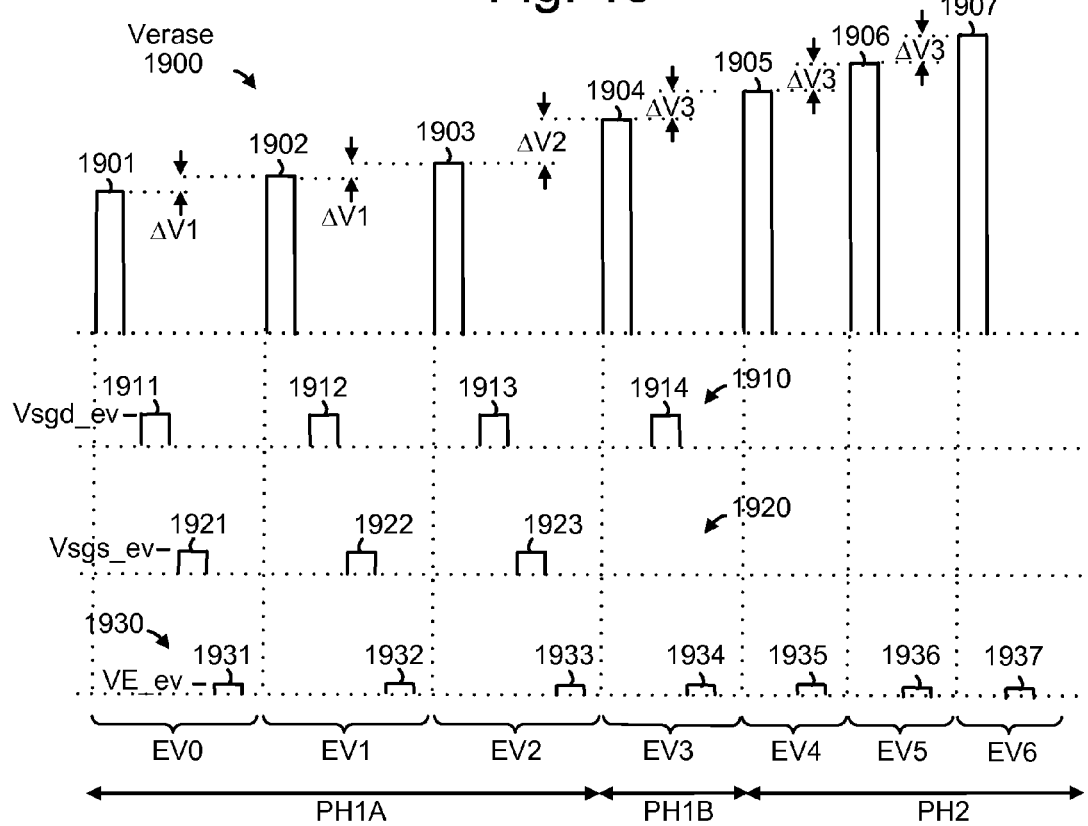
FIG. 19 depicts an alternative to FIG. 18A in which the SGS transistors complete an erase before SGD transistors.

FIG. 19 depicts an alternative to FIG. 18A in which the SGS transistors complete an erase before SGD transistors. Each erase-verify iteration includes an erase pulse 1901-1907 in a set 1900 of pulses, followed by one or more verify pulses. In this approach, there is an ABL configuration. The SGD transistors, SGS transistors and memory cells are erased and subject to an erase-verify test in each erase-verify iteration EV0-EV2 until the SGS transistors pass their respective erase-verify test in EV2. In a subsequent erase-verify iteration (e.g., EV3), the SGD transistors and memory cells are erased, and the SGD transistors pass their respective erase-verify test. In further subsequent erase-verify iterations (e.g., EV4-EV6), the SGD and SGS transistors are inhibited from being erased while the memory cells continue to be erased until the memory cells pass their respective erase-verify test in EV6.

The erase portion of the erase operation is consistent with step 1613 of FIG. 16 and the verify portion of the erase-verify iteration is consistent with steps 1621-1623 of FIG. 16. Specifically, a set 1910 of pulses comprising erase-verify pulses 1911-1914 for the SGD transistors at a level Vsgd_ev are applied in EV0-EV3, a set 1920 of pulses comprising erase-verify pulses 1921-1923 for the SGS transistors at a level Vsgs_ev are applied in EV0-EV2, and a set 1930 of pulses comprising erase-verify pulses 1931-1937 for the memory cells at a level VE_ev are applied in EV0-EV6. EV0-EV2 represent a first part of the first phase (PH1*a*) of FIG. 17, EV3 represents a second part of the first phase (PH1*b*) of FIG. 17 and EV4-EV6 represent the second phase (PH2) of FIG. 17.

The step size of the erase pulses is ΔV1 in the first phase, ΔV2 at a start of the second phase and ΔV3 in the remainder of the second phase.

Optionally, the control gate voltage (Vsgd_e) of the SGD transistor (a first select gate transistor) can be made different than the control gate voltage (Vsgs_e) of the SGS transistor (a second select gate transistor) to equalize an erase speed of the first select gate transistor and the second select gate transistor. For example, Vsgd_e>Vsgs_e to slow down the erase of the SGD transistors relative to the SGS transistors, or Vsgs_e>Vsgd_e to slow down the erase of the SGS transistors relative to the SGD transistors. See also FIG. 23A.

Figure 20A:
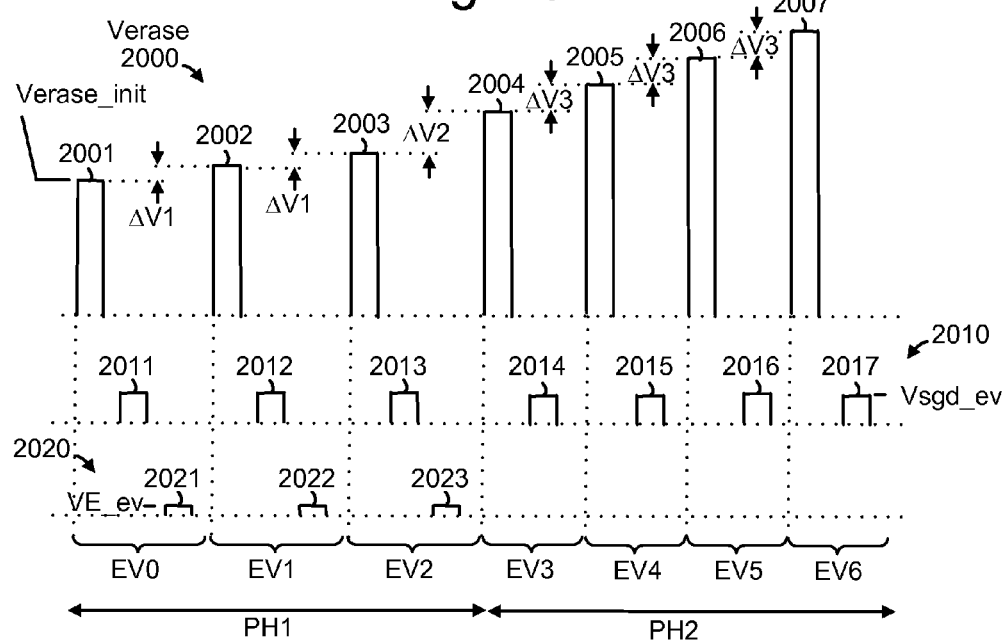
FIG. 20A depicts waveforms in an example of an erase operation for SGD transistors and memory cells in accordance with steps 1704, 1710, 1718, 1732 and 1734 of FIG. 17.

FIG. 20A depicts waveforms in an example of an erase operation for SGD transistors and memory cells in accordance with steps 1704, 1710, 1732 and 1734 of FIG. 17. A waveform 2000 represents a number of erase-verify iterations EV0-EV6. Each erase-verify iteration includes an erase pulse 2001-2007 in a set 2000 of pulses, followed by one or more verify pulses. Verase_init is an initial amplitude of the erase pulses. In this approach, there is an ABL configuration, and the SGD transistors and memory cells are erased and subject to an erase-verify test in each erase-verify iteration EV0-EV2 until the memory cells pass their respective erase-verify test in EV2. In the subsequent erase-verify iterations (e.g., EV3-EV6), the memory cells are inhibited from being erased by floating their control gate voltages while the SGD transistors continue to be erased until they pass their respective erase-verify test in EV6. The erase portion of the erase operation is consistent with step 1611 of FIG. 16 and the verify portion of the erase-verify iteration is consistent with steps 1621 and 1623 of FIG. 16.

Specifically, a set 2010 of pulses comprising erase-verify pulses 2011-2017 for the SGD transistors at a level Vsgd_ev are applied in EV0-EV2, and a set 2020 of pulses comprising erase-verify pulses 2021-2023 for the memory cells at a level VE_ev are applied in EV0-EV2. EV0-EV2 represent the first phase of FIG. 17, and EV3-EV6 represent the second phase of FIG. 17. EV0-EV2 can be considered to be one or more initial EV iterations and EV3-EV6 can be considered to be one or more additional EV iterations. In phase two, the dummy memory cells or non-volatile storage elements can be driven at a higher bias than in phase one to avoid being over-stressed by the increasing erase voltage. The step size of the erase pulses is ΔV1 in the first phase, ΔV2 at a start of the second phase and ΔV3 in the remainder of the second phase.

In this example, the erase of the memory cells is completed before erase of the select gate transistors. Optionally, the erase speed of the memory cells can be slowed so that the memory cells complete the erase at about the same EV iteration as the select gate transistors. This can be achieved by applying a relatively higher voltage on the word lines to reduce the substrate-to-control gate voltage of the memory cells and the corresponding erase effect. For example, 3 V can be used instead of 0.5 V.

The example of FIG. 20A could be modified by omitting the erase-verify pulses 2011-2013 to save time if the select gate transistors are not expected to complete erase in phase one. In this case, the select gate transistors can be erased or inhibited from being erased in EV0-EV2.

Figure 20B:
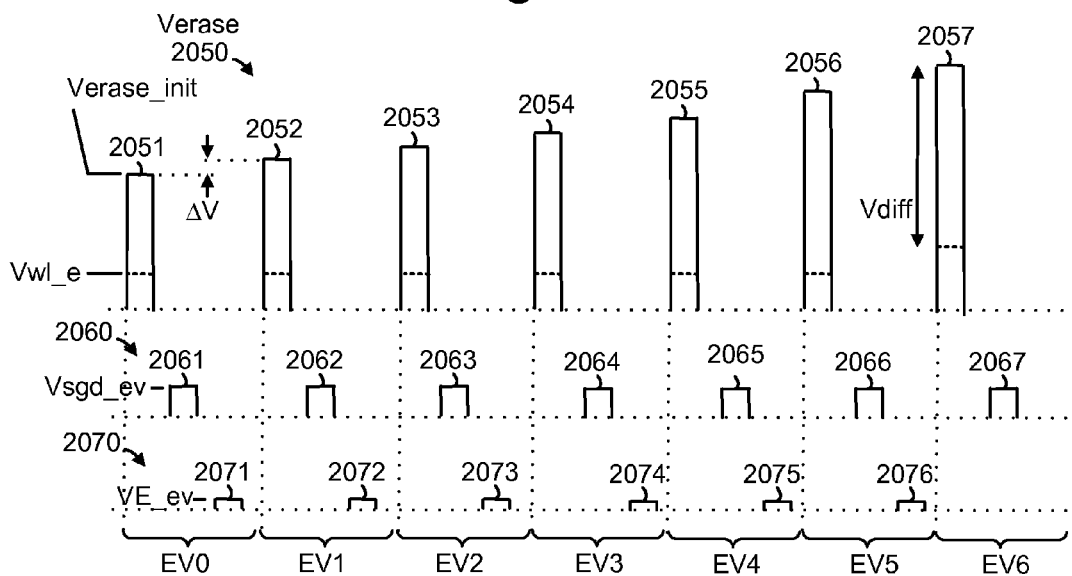
FIG. 20B depicts an alternative to FIG. 20A in which the erase speed of the SGD transistors and memory cells is roughly equalized.

FIG. 20B depicts an alternative to FIG. 20A in which the erase speed of the SGD transistors and memory cells is roughly equalized. In this approach, the erase speed of the memory cells is slowed by raising the control gate voltage Vwl_higher than in FIG. 20A, e.g., 3 V vs. 0.5 V. As a result, the memory cells complete the erase at EV5 and the SGD transistors complete the erase at EV6.

Moreover, similar to the approach of FIG. 18B, to ensure that the memory cells are not over-erased and that the SGD transistors complete their erase at about the same erase-verify iteration as the memory cells complete their erase, a slow down measure can be imposed on the memory cells by raising their control gate voltages to a higher level than in the example of FIG. 20A. With a higher control gate voltage, the voltage across the memory cells is reduced and the erase action is correspondingly reduced, for a given substrate voltage. The erase speed of the memory cells is thus equalized with the erase speed of the SGD transistors.

Another option is for the erase speed of the memory cells to be equalized with the erase speed of the SGS transistors.

A waveform 2050 represents a number of erase-verify iterations EV0-EV6. Each erase-verify iteration includes an erase pulse 2051-2057 in a set 2050 of pulses, followed by one or more verify pulses. Verase_int is the initial value of the erase voltage applied to substrate. In one approach, as indicated by the dashed lines, Vwl_e is initially fixed (in EV0-EV5), and then is stepped up at the same rate as Verase (by a step size $\Delta V$) in one or more subsequent erase-verify iterations after the memory cell passes the erase-verify test (e.g., in EV6), so that the difference between them (Vdiff) and the corresponding erase effect, is fixed in the erase operation. This maintains a constant difference (Vdiff) between Verase and Vwl_e which prevents further erase of the memory cell. Another approach to prevent further erase of the memory cell is to float the control gate voltage (e.g., the word line voltage) of the memory cell. Vwl_e can be fixed while the memory cell is being erased since it is expected that the memory cell will complete the erase before the SGD transistor. Thus, there is no need to accelerate the erase of the memory cell. Optionally, Vwl_e could be stepped up while the memory cell is being erased.

A set 2060 of pulses comprising erase-verify pulses 2061-2067 for the SGD transistors at a level Vsgd_ev are applied in EV0-EV6, and a set 2070 of pulses comprising erase-verify pulses 2071-2076 for the memory cells at a level VE_ev are applied in EV0-V5.

FIG. 21 depicts waveforms in an example of an erase operation for SGD transistors and memory cells in accordance with steps 1706, 1712, 1724 and 1726 of FIG. 17. A waveform 2100 represents a number of erase-verify iterations EV0-EV6. Each erase-verify iteration includes an erase pulse 2101-2107 in a set 2100 of pulses, followed by one or more verify pulses. In this approach, there is an ABL configuration, and the SGD transistors are erased and subject to an erase-verify test in each erase-verify iteration EV0-EV2 until the SGD transistors pass their respective erase-verify test in EV2. The memory cells can be erased but are not subject to an erase-verify test in each erase-verify iteration EV0-EV2.

In the subsequent erase-verify iterations (e.g., EV3-EV6), the SGD transistors are inhibited from being erased while the memory cells continue to be erased until the memory cells pass their respective erase-verify test in EV6. The erase portion of the erase operation is consistent with step 1611 of FIG. 16 and the verify portion of the erase-verify iteration is consistent with steps 1621 and 1623 of FIG. 16. Specifically, a set 2110 of pulses comprising erase-verify pulses 2111-2113 for the SGD transistors at a level Vsgd_ev are applied in EV0-EV2, while no erase-verify pulses are applied for the memory cells. A set 2120 of pulses comprising erase-verify pulses 2121-2124 for the memory cells at a level VE_ev are applied in EV3-EV6. EV0-EV2 represent the first phase of FIG. 17, and EV3-EV6 represent the second phase of FIG. 17. EV0-EV2 can be considered to be one or more initial EV iterations and EV3-EV6 can be considered to be one or more additional EV iterations.

The step size of the erase pulses is $\Delta V1$ in the first phase, $\Delta V2$ at a start of the second phase and $\Delta V3$ in the remainder of the second phase. This approach saves time because the erase-verify test for the memory cells is not performed for the initial erase-verify iterations in phase one when the memory cells are unlikely to have completed erase. In one approach, the memory cells are configured to be erased in phase one. This gives the memory cells a head start in being erased. A limit can be enforced on the number of erase-verify iterations in phase one to avoids the possibility that a memory cell will complete erase and become over-erased in phase one.

In another approach, the memory cells are inhibited from being erased in phase one. This ensures that the memory cells start their erase in phase two from a common Vth starting point and avoids the possibility that a memory cell will complete erase in phase one. If the memory cells are inhibited from being erased by floating their control gate voltages, the dummy word lines and memory cells can be biased at a fixed voltage so that they isolate the select gate transistor from the non-dummy memory cells.

FIG. 22A depicts an alternative to FIG. 21 in which SGD_even and SGD_odd transistors are separately verified. A waveform 2200 represents a number of erase-verify iterations EV0-EV6. Each erase-verify iteration includes an erase pulse 2201-2207 in a set 2200 of pulses, followed by one or more verify pulses. In this approach, there is an SBL configuration. The SGD_even transistors, SGD_odd transistors and memory cells are erased in each erase-verify iteration EV0-EV2 until the SGD_even transistors and SGD_odd transistors pass their respective erase-verify test in EV2. In this example, SGD_even/odd transistors both pass their respective erase-verify test in EV2. EV0-EV2 can be considered to be one or more initial EV iterations and EV3-EV6 can be considered to be one or more additional EV iterations.

In the subsequent erase-verify iterations (e.g., EV3-EV6), the SGD_even transistors and SGD_odd transistors are inhibited from being erased while the memory cells continue to be erased until the memory cells pass their respective erase-verify test in EV6. As a simplification, MC_even/odd both pass their respective erase-verify test in EV6. The erase portion of the erase operation is consistent with step 1615 of FIG. 16 and the verify portion of the erase-verify iteration is consistent with steps 1625, 1626, 1629 and 1630 of FIG. 16.

Specifically, a set 2210 of pulses comprising erase-verify pulses 2211-2213 for the SGD_even transistors at a level Vsgd_even_ev, and erase-verify pulses 2214-2216 for the SGD_odd transistors at a level Vsgd_odd_ev, which can be the same or different than Vsgd_even_ev, are applied in EV0-EV2, while no erase-verify pulses are applied for the memory cells. A set 2220 of pulses comprising erase-verify pulses 2221-2224 for the memory cells of even-numbered NAND strings at a level VE_even_ev, and erase-verify pulses 2225-2228 for the memory cells of odd-numbered NAND strings at a level VE_odd_ev, which can be the same or different than VE_even_ev, are applied in EV3-EV6. EV0-EV2 represent the first phase of FIG. 17, and EV3-EV6 represent the second phase of FIG. 17.

The step size of the erase pulses is $\Delta V1$ in the first phase, $\Delta V2$ at a start of the second phase and $\Delta V3$ in the remainder of the second phase.

FIG. 22B depicts an alternative to FIG. 22A, where the SGD_even transistors complete erase before the SGD_odd transistors. The waveforms of FIG. 22A are repeated except the set 2250 of erase pulses includes erase pulses 2253-2257 in place of, and with a lower amplitude than, erase pulse 2204-2207, respectively. The SGD_even transistors complete erase in EV1, and the SGD_odd transistors complete erase in EV2. The SGD_even and SGD_odd transistors can complete their erase at different times due to small variations in erase speed. However, when the SGD_even transistors complete their erase, the SGD_odd transistors are likely very close to completing their erase as well, such as in the next erase-verify iteration. Similarly, when the SGD_odd transistors complete their erase, the SGD_even transistors are likely very close to completing their erase as well. In such cases, to avoid over-erase of the select gate transistors of even- and odd-numbered NAND strings which have not yet completed erase, their erase speed can be slowed in the erase-verify iteration which is directly after the erase-verify iteration in which the select gate transistors of odd- and even-numbered NAND strings, respectively, have completed erase.

For example, one approach to slowing the erase of the SGD_odd transistors in EV2 is to provide a reduce step up for the erase pulse 2253 (e.g., $\Delta V1a<\Delta V$). Another approach is to raise the control gate voltages Vsgd_odd e of the SGD_odd transistors in EV2 as represented by the dashed line in erase pulse 2253. Both approaches can be used together as well. Both approaches slow down erasing by reducing the substrate-to-control gate voltage.

FIG. 23A depicts voltages during erasing of SGD and SGS transistors and memory cells in an ABL configuration in accordance with steps 1611-1613 of FIG. 16. The first column provides voltages for the case of concurrent erase of SGD transistors and memory cells. The second column provides voltages for the case of concurrent erase of SGS transistors and memory cells. The third column provides voltages for the case of concurrent erase of SGD transistors, SGS transistors and memory cells. The bit line (BL) and source line (SL) can be floated in each case. Vsgd_e (e.g., 0.5 V) is a control gate voltage which allows the SGD transistors to be erased. Vwldd_e (e.g., 2 V) is a control gate voltage which inhibits the WLDD memory cells from being erased and helps isolate the plurality of non-volatile storage elements from capacitive coupling from a SG transistor being programmed. In contrast, allowing the control gate voltage of the dummy memory cells to float can result in coupling from the SG transistor to the memory cells via the dummy memory cell, as well as creating a higher electric field at the select gate-to-dummy word line junction which can reduce endurance. Thus, during each erase portion of the one or more additional erase-verify iterations, a control gate voltage of the dummy non-volatile storage element is set to discourage over-erase of the plurality of non-volatile storage elements as an SG transistor (a first select gate transistor) is erased.

Vwlds_e (e.g., 2 V) is a control gate voltage which inhibits the WLDS memory cells from being erased. Vwl_e (e.g., 0.5 V) is a control gate voltage which allows the associated memory cells to be erased.

FIG. 23B depicts voltages during erase-verify of SGD and SGS transistors and memory cells in an ABL configuration in accordance with steps 1621-1623 of FIG. 16. The first column provides voltages for erase-verify of SGD transistors. The second column provides voltages for erase-verify of SGS transistors. The third column provides voltages for erase-verify of word lines (comprising MC_even/odd). The bit line is at a sense level, Vsense. In the first column, the SGD transistor is at an erase-verify level, Vsgd_ev (e.g., 1-1.5 V). In the second and third columns, the SGD transistor is in a conductive state due to Vread, e.g., 3.5 V. In one approach, Vread for the select gates can be set lower than Vread for the memory cells (e.g., 7 V) to avoid an excessive voltage on the select gate. WLDD, WL0-WL63 and WLDS are also at Vread to provide the associated storage elements in a conductive state. The SGS transistor is in a conductive state due to Vsg. Vsl can be, e.g., 1 V.

In the second column, the SGS transistor is at an erase-verify level, Vsgs_ev (e.g., 1-1.5 V). The SGD transistor is in a conductive state due to Vsg.

In the third column, MC_even/odd are at the generic erase-verify level of VE_ev (e.g., 0-1 V) or at respective erase verify levels of VE_even_ev and VE_odd EV. The SGD and SGS transistors are in a conductive state due to Vsg.

The Vread values can be the same or different for the select gate transistors and memory cells. The Vread values can be the same or different for SGD and SGS transistors. The Vread values can be the same or different for the dummy and non-dummy memory cells.

FIG. 23C depicts voltages during erasing of SGD and SGS transistors and memory cells in a SBL configuration in accordance with steps 1615-1617 of FIG. 16. The first column provides voltages for the case of concurrent erase of SGD_even/odd transistors and memory cells (MC_even/MC_odd). The second column provides voltages for the case of concurrent erase of SGD_even/odd transistors, SGS_even/odd transistors and memory cells (MC_even/odd). The third column provides voltages for the case of concurrent erase of SGS_even/odd transistors and memory cells (MC_even/MC_odd). The bit line (BL) and source line (SL) are floated in each case. Vsgd_e (e.g., 0.5 V) is a control gate voltage which allows the SGD transistors to be erased. Vwldd_e (e.g., 2 V) is a control gate voltage which inhibits the WLDD memory cells from being erased. Vwlds_e (e.g., 2 V) is a control gate voltage which inhibits the WLDS memory cells from being erased. Vwl_e (e.g., 0.5 V) is a control gate voltage which allows the associated memory cells to be erased.

FIG. 23D depicts voltages during erase-verify of SGD and SGS transistors in an SBL configuration in accordance with steps 1625-1630 of FIG. 16. The first column provides voltages for erase-verify of SGD_even transistors. The second column provides voltages for erase-verify of SGD_odd transistors. The third column provides voltages for erase-verify of SGS_even transistors. The third column provides voltages for erase-verify of SGS_odd transistors. In each column, the bit line is at a sense level, Vsense.

In the first column, the SGD_even transistors are at an erase-verify level, Vsgd_even_ev and the SGD_odd transistors are in a non-conductive state due to 0 V being applied. The memory cells and the SGS_even/odd transistors are in a conductive state due to Vsg. In the second column, the SGD_even transistors are in a non-conductive state due to 0 V being applied and the SGD_odd transistors are at an erase-verify level, Vsgd_odd_ev. The memory cells are in a conductive state due to Vread. The SGS_even/odd transistors are in a conductive state due to Vsg. In the third column, the SGS_even/odd transistors are at an erase-verify level, Vsgs_ev. The memory cells are in a conductive state due to Vread. The SGD_even transistors are in a conductive state due to Vsg. The SGD_odd transistors are in a non-conductive state due to 0 V.

FIG. 23E depicts voltages during erase-verify of memory cells in an SBL configuration in accordance with steps 1625-1630 of FIG. 16 as a continuation of FIG. 23D. The first column provides voltages for MC_even. The second column provides voltages for MC_odd.

In the first column, MC_even (WL0-WL63) are at the generic erase-verify level of VE_ev. The SGD_even and SGS_even/odd transistors are in a conductive state due to Vsg, and the memory cells are in a conductive state due to Vread. The SGD_odd transistors are in a non-conductive state due to 0 V being applied so that the odd-numbered NAND strings do not interfere with the sensing of the even-numbered NAND strings.

In the second column, MC_odd (WL0-WL63) are at the generic erase-verify level of VE_ev. The SGD_odd and SGS_even/odd transistors are in a conductive state due to Vsg, and the memory cells are in a conductive state due to Vread. The SGD_even transistors are in a non-conductive state due to 0 V being applied so that the even-numbered NAND strings do not interfere with the sensing of the odd-numbered NAND strings.

Accordingly, it can be seen that, in one embodiment, a method is provided for performing an erase operation in a non-volatile storage device (190). The method includes: determining that an erase command has been made to erase a plurality of non-volatile storage elements (230, 270, 271) of a NAND string (NS0, NS0A, NS1A); in response to the determining that the erase command has been made, determining whether a condition is met for erasing a first select gate transistor (206, 208, 250, 251, 260, 261) of the NAND string, the NAND string is formed on a substrate (209); and in response to the determining that the condition is met for erasing the first select gate transistor: performing an erase operation comprising one or more erase-verify iterations (EV0-EV6), each erase-verify iteration of the one or more erase-verify iterations comprises an erase portion during which an erase voltage (1801-1807, 1901-1907, 2001-2007, 2051-2057, 2101-2107, 2201-2207, 2253-2257) is applied to the substrate while a control gate voltage (Vsgd_e, Vsgs_e) of the first select gate transistor and a control gate voltage (Vwl_e) of the plurality of non-volatile storage elements are set to allow erasing of the first select gate transistor and the plurality of non-volatile storage elements, respectively, and a verify portion which performs an erase-verify test for the first select gate transistor.

In another embodiment for an associated apparatus, a non-volatile storage device (190) comprises: a substrate (209); a NAND string (NS0, NS0A, NS1A) formed on the substrate, the NAND string comprising a plurality of non-volatile storage elements (230, 270, 271), a first select gate transistor (208, 250, 251) at one end of the NAND string and a second select gate transistor (206, 260, 261) at another end of the NAND string; and a control circuit (100, 110, 112, 114, 116, 150, 160, 165, 192, MC0). The control circuit makes a determination that an erase command has been made to erase the plurality of non-volatile storage elements, in response to the determination that the erase command has been made, makes a determination that a condition is met for erasing the first select gate transistor, and, in response to the determination that the condition is met for erasing the first select gate transistor: performs an erase operation comprising one or more erase-verify iterations (EV0-EV6), each erase-verify iteration of the one or more erase-verify iterations comprises an erase portion during which an erase voltage (1801-1807, 1901-1907, 2001-2007, 2051-2057, 2101-2107, 2201-2207, 2253-2257) is applied to the substrate while a control gate voltage (Vsgd_e) of the first select gate transistor and a control gate voltage (Vwl_e) of the plurality of non-volatile storage elements are set to allow erasing of the first select gate transistor and the plurality of non-volatile storage elements, respectively, and a verify portion which performs an erase-verify test for the first select gate transistor.

In another embodiment, a method for performing a programming operation in a non-volatile storage device comprises: determining that a program command has been made to program a plurality of non-volatile storage elements (230, 270, 271) of a plurality of NAND strings (NS0-NS11, NS0A, NS1A, NS2A, NS3A) formed on a substrate (209); in response to the determining that the program command has been made, determining whether a condition is met for programming select gate transistors (206, 208, 250-253, 260-263) of the plurality of NAND strings; and in response to the determining that the program command has been made and the condition is met for programming the select gate transistors: before programming the plurality of non-volatile storage elements, performing a programming operation for the select gate transistors by performing one or more program-verify iterations (PV0-PV4), each program-verify iteration of the one or more program-verify iterations comprises a program portion during which a program pulse (Vsgd_p, Vsgs_p) is applied to control gates of the select gate transistors, and a verify portion during which a program-verify test is performed for the select gate transistors.

An associated non-volatile storage device comprises: a substrate; a plurality of NAND strings formed on the substrate, the plurality of NAND strings comprising a plurality of non-volatile storage elements, a select gate transistor at one end of each NAND string; and a control circuit. The control circuit makes a determination that a program command has been made to program the plurality of non-volatile storage elements, in response to the determination that the program command has been made, makes a determination that a condition is met for programming the select gate transistors, and, in response to the determination that the condition is met for programming the select gate transistors: before programming the plurality of non-volatile storage elements, performs a programming operation using one or more program-verify iterations (PV0-PV4) for the select gate transistors, each program-verify iteration of the one or more program-verify iterations comprises a program portion during which a program pulse (Vsgd_p, Vsgs_p) is applied to control gates of the select gate transistors and a verify portion during which a program-verify test is performed for the select gate transistors.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for performing an erase operation, comprising:
    determining that an erase command has been made to erase a plurality of memory cells formed above a substrate in a three-dimensional non-volatile memory, the plurality of memory cells are coupled to a first select gate transistor;
    in response to the determining that the erase command has been made, determining that a condition is met for erasing the first select gate transistor; and
    in response to the determining that the condition is met for erasing the first select gate transistor: performing an erase operation comprising one or more erase-verify iterations, each erase-verify iteration of the one or more erase-verify iterations comprises:
an erase portion during which an erase voltage is applied to the plurality of memory cells and the first select gate transistor while a control gate voltage of the first select gate transistor and a control gate voltage of the plurality of memory cells are set to allow erasing of the first select gate transistor and the plurality of memory cells, respectively, and
a verify portion during which an erase-verify test is performed for the first select gate transistor.

2. The method of claim 1, wherein:
the control gate voltage of the first select gate transistor is higher than the control gate voltage of the plurality of memory cells and a substrate-to-control gate voltage of the first select gate transistor is lower than a substrate-to-control gate voltage of the plurality of memory cells.

3. The method of claim 1, wherein:
the determining that the condition is met for erasing the first select gate transistor comprises determining that a threshold voltage of the first select gate transistor exceeds an upper bound of an acceptable range of threshold voltages.

4. The method of claim 1, wherein:
the first select gate transistor is at one end of the plurality of memory cells and a second select gate transistor is at an opposite end of the plurality of memory cells; and
for each of the one or more erase-verify iterations: during the erase portion, a control gate voltage of the second select gate transistor is set to allow erasing of the second select gate transistor, and during the verify portion, an erase-verify test is performed for the second select gate transistor separately from the erase-verify test for the first select gate transistor.

5. The method of claim 4, wherein:
the control gate voltage of the first select gate transistor is made different than the control gate voltage of the second select gate transistor to equalize an erase speed of the first select gate transistor and the second select gate transistor.

6. The method of claim 1, wherein:
the erase voltage and the control gate voltage of the first select gate transistor are stepped up in one or more of the one or more erase-verify iterations.

7. The method of claim 1, wherein:
during the verify portion, an erase-verify test is performed for the plurality of memory cells, separately from the erase-verify test for the first select gate transistor.

8. The method of claim 7, further comprising:
when the erase-verify test for the plurality of memory cells is passed, performing one or more additional erase-verify iterations for the first select gate transistor, each erase-verify iteration of the one or more additional erase-verify iterations comprises:
an erase portion during which an erase voltage is applied to the plurality of memory cells and the first select gate transistor while the control gate voltage of the first select gate transistor is set to allow erasing of the first select gate transistor and the control gate voltage of the plurality of memory cells is floated to inhibit erasing of the plurality of memory cells, and
a verify portion during which an erase-verify test is performed for the first select gate transistor but not for the plurality of memory cells.

9. The method of claim 8, wherein:
a default step size of the erase voltage of the one or more additional erase-verify iterations is different than a step size of the erase voltage in the one or more erase-verify iterations.

10. The method of claim 9, wherein:
an initial step size of the erase voltage of the one or more additional erase-verify iterations is greater than the step size of the erase voltage in the one or more erase-verify iterations, and greater than the default step size.

11. The method of claim 8, wherein:
a dummy memory cell is between the first select gate transistor and the plurality of memory cells; and
during each erase portion of the one or more additional erase-verify iterations, a control gate voltage of the dummy memory cell is set to discourage over erase of the plurality of memory cells as the first select gate transistor is erased.

12. The method of claim 1, further comprising:
when the erase-verify test for the first select gate transistor is passed, performing one or more additional erase-verify iterations for the plurality of memory cells, each erase-verify iteration of the one or more additional erase-verify iterations comprises an erase portion during which an erase voltage is applied to the plurality of memory cells and the first select gate transistor while the control gate voltage of the first select gate transistor is floated to inhibit erasing of the first select gate transistor and the control gate voltage of the plurality of memory cells is set to allow erasing of the plurality of memory cells, and a verify portion during which an erase-verify test is performed for the plurality of memory cells but not for the first select gate transistor.

13. The method of claim 12, wherein:
during the verify portion of the one or more erase-verify iterations, an erase-verify test is not performed for the plurality of memory cells.

14. The method of claim 12, wherein:
a default step size of the erase voltage of the one or more additional erase-verify iterations is different than a step size of the erase voltage in the one or more erase-verify iterations.

15. The method of claim 14, wherein:
an initial step size of the erase voltage of the one or more additional erase-verify iterations is greater than the step size of the erase voltage in the one or more erase-verify iterations and greater than the default step size.

16. The method of claim 1, further comprising:
in response to the first select gate transistor passing the erase-verify test, determining that a threshold voltage of the first select gate transistor is below a lower bound of an acceptable range of threshold voltages; and
in response to the determining that the threshold voltage of the first select gate transistor is below the lower bound of the acceptable range of threshold voltages: performing a programming operation comprising one or more program-verify iterations, each program-verify iteration comprises a program portion during which the control gate voltage of the first select gate transistor receives a program pulse and a verify portion during which a program-verify test is performed for the first select gate transistor.

17. The method of claim 16, further comprising:
determining that a program command has been made to program the plurality of memory cells of the plurality of memory cells; and in response to the determining that the program command has been made, and in response to the first select gate transistor passing the program-verify test: performing a programming operation comprising one or more program-verify iterations for the plurality of memory cells.

18. The method of claim 1, wherein:
the determining that the condition is met for erasing the first select gate transistor comprises determining that a specified time period has elapsed since a last erasing of the first select gate transistor and determining a temperature history of the three-dimensional non-volatile memory in the specified time period.

19. The method of claim 1, wherein:
the determining that the erase command has been made, the determining that the condition is met, and the performing the erase operation are performed by circuitry which is associated with operation of the plurality of memory cells and the first select gate transistor, and the circuitry is above the substrate.

20. A non-volatile storage device, comprising:
a substrate;
a plurality of memory cells formed above a substrate in a three-dimensional non-volatile memory;
a first select gate transistor at one end of the plurality of memory cells;
a second select gate transistor at another end of the plurality of memory cells; and
circuitry coupled with the plurality of memory cells and the first and second select gate transistors, the circuitry makes a determination that an erase command has been made to erase the plurality of memory cells, in response to the determination that the erase command has been made, makes a determination that a condition is met for erasing the first select gate transistor, and, in response to the determination that the condition is met for erasing the first select gate transistor: performs an erase operation comprising one or more erase-verify iterations, each erase-verify iteration of the one or more erase-verify iterations comprises an erase portion during which an erase voltage is applied to the substrate while a control gate voltage of the first select gate transistor and a control gate voltage of the plurality of memory cells are set to allow erasing of the first select gate transistor and the plurality of memory cells, respectively, and a verify portion during which an erase-verify test is performed for the first select gate transistor.

21. The non-volatile storage device of claim 20, wherein:
the determination that the condition is met for erasing the first select gate transistor comprises a determination that a count of program-erase cycles exceeds a threshold count.

22. The non-volatile storage device of claim 20, wherein:
the plurality of memory cells comprise flat memory cells.

23. The non-volatile storage device of claim 20, wherein:
the determination that the condition is met for erasing the first select gate transistor is based on a temperature history of the non-volatile storage device.

24. The non-volatile storage device of claim 20, wherein:
the circuitry is above the substrate.

25. A non-volatile storage device, comprising:
a substrate;
a plurality of memory cells formed above a substrate in a three-dimensional non-volatile memory;
a first select gate transistor at one end of the plurality of memory cells;
a second select gate transistor at another end of the plurality of memory cells; and
circuitry coupled with the plurality of memory cells and the first and second select gate transistors, the circuitry is configured to:
make a determination that an erase command has been made to erase the plurality of memory cells,
in response to the determination that the erase command has been made, make a determination that a condition is met for erasing the first select gate transistor, and
in response to the determination that the condition is met for erasing the first select gate transistor,: perform an erase operation comprising one or more erase-verify iterations, each erase-verify iteration of the one or more erase-verify iterations comprises an erase portion during which an erase voltage is applied to the substrate while a control gate voltage of the first select gate transistor and a control gate voltage of the plurality of memory cells are set to allow erasing of the first select gate transistor and the plurality of memory cells, respectively, and a verify portion during which an erase-verify test is performed for the first select gate transistor.

26. The non-volatile storage device of claim 25, wherein:
the determination that the condition is met for erasing the first select gate transistor comprises a determination that a count of program-erase cycles exceeds a threshold count.

27. The non-volatile storage device of claim 25, wherein:
the plurality of memory cells comprise flat memory cells.

28. The non-volatile storage device of claim 25, wherein:
the determination that the condition is met for erasing the first select gate transistor is based on a temperature history of the non-volatile storage device.

29. The non-volatile storage device of claim 25, wherein:
the circuitry is above the substrate.

* * * * *